(12) United States Patent
An et al.

(10) Patent No.: US 12,217,640 B2
(45) Date of Patent: Feb. 4, 2025

(54) DISPLAY PANEL, ELECTRONIC DEVICE INCLUDING THE SAME, AND METHOD OF FABRICATING ELECTRONIC DEVICE

(71) Applicant: SAMSUNG DISPLAY CO., LTD., Yongin-si (KR)

(72) Inventors: Jinsung An, Gwacheon-si (KR); Sungho Kim, Suwon-si (KR); Seokje Seong, Seongnam-si (KR); Minwoo Woo, Seoul (KR); Seunghyun Lee, Asan-si (KR); Wangwoo Lee, Osan-si (KR); Jiseon Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 231 days.

(21) Appl. No.: 17/648,959

(22) Filed: Jan. 26, 2022

(65) Prior Publication Data
US 2022/0343817 A1 Oct. 27, 2022

(30) Foreign Application Priority Data

Apr. 27, 2021 (KR) ........................ 10-2021-0054581

(51) Int. Cl.
*G09G 3/00* (2006.01)
*H10K 59/121* (2023.01)
*H10K 59/131* (2023.01)
*H10K 59/40* (2023.01)
*H10K 59/12* (2023.01)

(52) U.S. Cl.
CPC ........... *G09G 3/006* (2013.01); *H10K 59/121* (2023.02); *H10K 59/131* (2023.02); *H10K 59/40* (2023.02); *H10K 59/1201* (2023.02)

(58) Field of Classification Search
CPC .... G09G 3/006; H10K 59/121; H10K 59/131; H10K 59/40; H10K 59/1201
See application file for complete search history.

(56) References Cited

U.S. PATENT DOCUMENTS

| | | |
|---|---|---|
| 7,633,473 B2 | 12/2009 | Uh et al. |
| 8,654,069 B2 | 2/2014 | Mamba et al. |
| 9,262,952 B2 | 2/2016 | Kim et al. |
| 10,636,339 B2 | 4/2020 | Kim et al. |
| 10,847,432 B2 | 11/2020 | Ka et al. |
| 2016/0260367 A1* | 9/2016 | Kwak .................. G09G 3/3291 |

(Continued)

FOREIGN PATENT DOCUMENTS

| | | | |
|---|---|---|---|
| CN | 105093593 A | * 11/2015 | ........... G02F 1/1309 |
| JP | 2009103866 A | * 5/2009 | |

(Continued)

*Primary Examiner* — Lee E Rodak
*Assistant Examiner* — Demetrius R Pretlow
(74) *Attorney, Agent, or Firm* — F. CHAU & ASSOCIATES, LLC

(57) ABSTRACT

A display panel includes a plurality of first pixels on a first region, a plurality of second pixels on a second region, and a test circuit. The second region has a transmittance less than a transmittance of the first region. The test circuit provides one or more test voltages to the first pixels and the second pixels. The test circuit includes a first test circuit and a second test circuit. The first test circuit provides the first pixels with a first voltage, and the second test circuit provides the second pixels with a second voltage different from the first voltage.

19 Claims, 15 Drawing Sheets

(56) References Cited

U.S. PATENT DOCUMENTS

| | | | | |
|---|---|---|---|---|
| 2019/0311662 A1* | 10/2019 | Kim | .................. | G09G 3/2007 |
| 2019/0371691 A1* | 12/2019 | Han | .................. | H05K 1/0268 |
| 2021/0097936 A1* | 4/2021 | Ge | .................. | G09G 3/2011 |
| 2022/0301482 A1* | 9/2022 | Wang | .................. | G09G 3/3208 |
| 2022/0328598 A1* | 10/2022 | Zhao | .................. | G09G 3/006 |

FOREIGN PATENT DOCUMENTS

| | | |
|---|---|---|
| KR | 10-2006-0077734 | 7/2006 |
| KR | 10-2018-0030286 | 3/2018 |
| KR | 101935588 B1 * | 1/2019 |
| KR | 10-2019-0027050 | 3/2019 |
| KR | 10-2054849 | 12/2019 |

\* cited by examiner

DISPLAY PANEL, ELECTRONIC DEVICE INCLUDING THE SAME, AND METHOD OF FABRICATING ELECTRONIC DEVICE

CROSS-REFERENCE TO RELATED APPLICATION

This U.S. nonprovisional application claims priority under 35 U.S.C § 119 to Korean Patent Application No. 10-2021-0054581, filed on Apr. 27, 2021, in the Korean Intellectual Property Office, the disclosure of which is hereby incorporated by reference in its entirety.

1. FIELD OF DISCLOSURE

One or more embodiments described herein relate to a display panel, an electronic device including the same, and a method of fabricating an electronic device.

2. DESCRIPTION OF THE RELATED ART

Many electronic devices have display panels that display images generated from camera modules and received from other media sources. Each of the display panels includes a plurality of elements that output light to generate the images. In some display panels, a test process is performed to examine whether or not the light emitting elements have defects. The test process may be performed by the manufacturer before shipment.

SUMMARY

One or more embodiments described herein provide a display panel with increased reliability, an electronic device that includes such a display panel, and a method of fabricating an electronic device in a manner which may increase product reliability.

In accordance with one or more embodiments, a display panel includes a plurality of first pixels on a first region; a plurality of second pixels on a second region having a transmittance less than a transmittance of the first region; and a test circuit configured to provide one or more test voltages to the plurality of first pixels and the plurality of second pixels, wherein the test circuit includes: a first test circuit configured to provide the plurality of first pixels with a first voltage; and a second test circuit configured to provide the plurality of second pixels with a second voltage different from the first voltage.

In accordance with one or more embodiments, an electronic device includes an electronic module; and a display panel comprising a first region and a second region adjacent to the first region, the first region overlapping the electronic module. The display panel includes a plurality of first pixels on the first region; a plurality of second pixels on the second region; a first group data line connected to one of the plurality of first pixels and one of the plurality of second pixels; a second group data line connected to another of the plurality of second pixels; and a test circuit comprising a first test circuit connected to the first group data line, a second test circuit connected to the second group data line, and a switch circuit connected between the first group data line and the second test circuit.

In accordance with one or more embodiments, a method of fabricating an electronic device including testing a display panel that includes a plurality of first pixels on a first region, a plurality of second pixels on a second region having a transmittance less than a transmittance of the first region, and a test circuit configured to provide a test voltage to the plurality of first pixels and the plurality of second pixels; and cutting a portion of the display panel. Testing the display panel includes performing a first test operation that includes providing a first voltage to a first group data line connected to some of the plurality of first pixels and some of the plurality of second pixels and providing a second voltage to a second group data line connected to some other of the plurality of second pixels, the second voltage being different from the first voltage; and performing a second test operation that includes providing the second voltage to the first group data line and providing the second voltage to the second group data line.

DETAILED DESCRIPTION OF EMBODIMENTS

Figure 1:
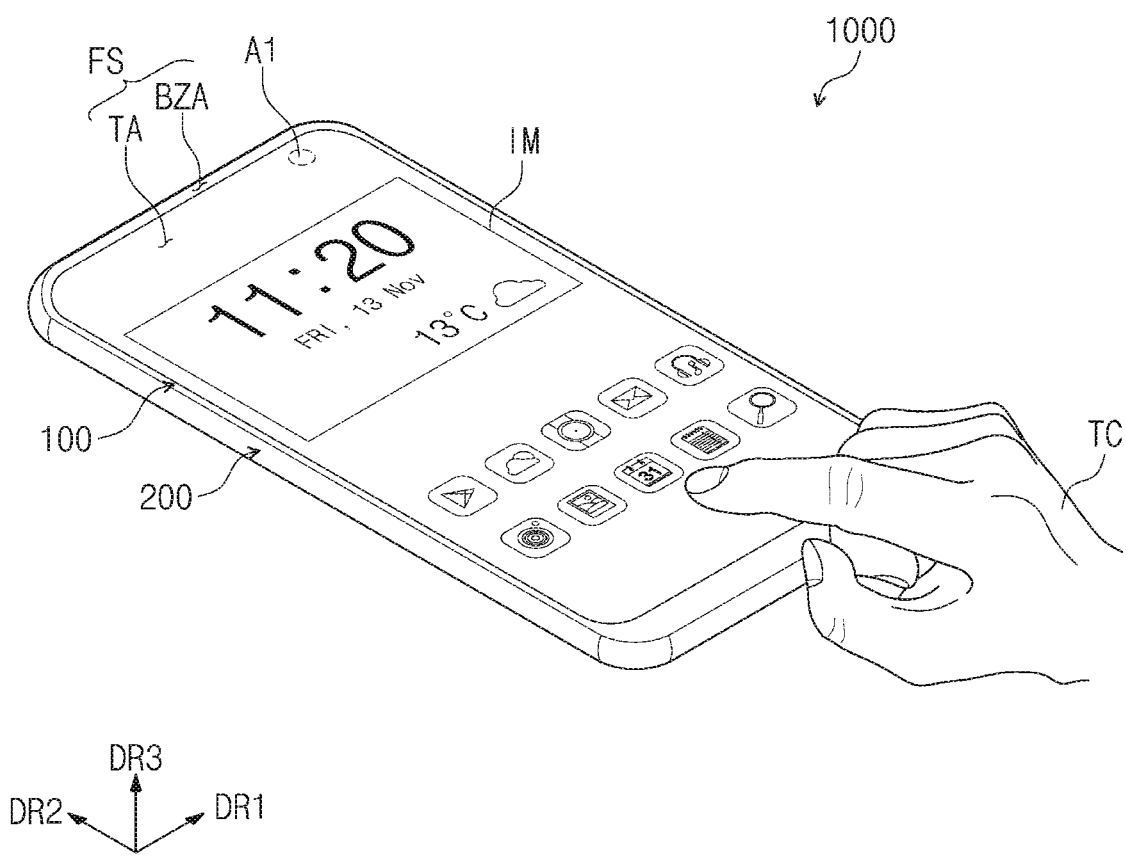
FIG. 1 illustrates an embodiment of an electronic device.

In this description, when a certain component (or region, layer, portion, etc.) is referred to as being "on", "connected to", or "coupled to" other component(s), the certain component may be directly on, directly connected to, or directly coupled to the other component(s) or at least one intervening component may be present therebetween. Like numerals indicate like components. Moreover, in the drawings, thicknesses, ratios, and dimensions of components are exaggerated for effectively explaining the technical contents. The term "and/or" includes one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the scope of the embodiments described herein. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings. It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

Unless otherwise defined, terms used herein including technical and scientific terms have the meaning generally understood by one of ordinary skilled in the art. Also, terms as defined in dictionaries generally used should be understood as having that meaning or a meaning contextually defined in the art and should not be understood as ideally or excessively formal meaning unless definitely defined herein.

The following will now describe some embodiments of the present invention in conjunction with the accompanying drawings.

Figure 2A:
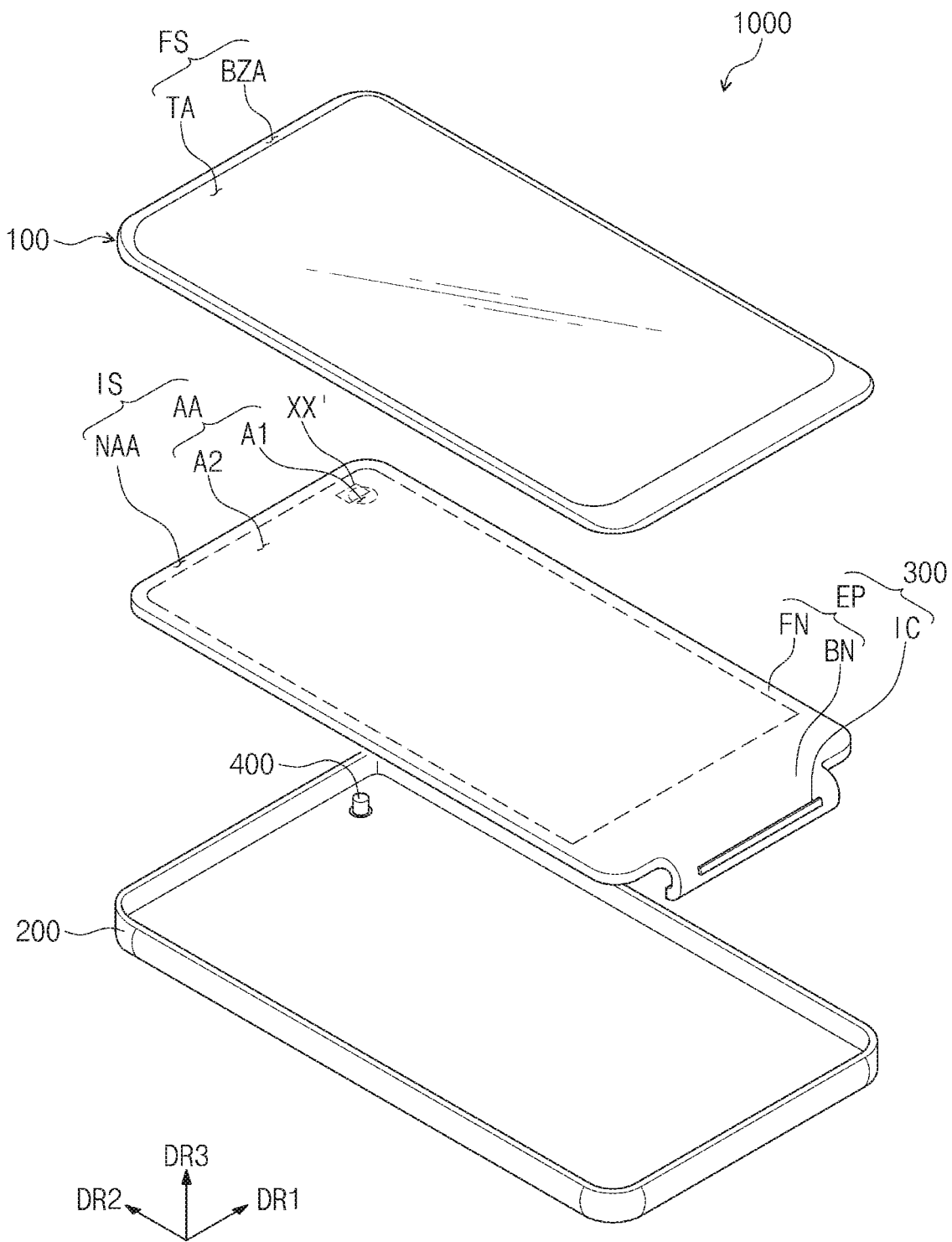
FIG. 2A illustrates an exploded view of the electronic device according to an embodiment.
Figure 2B:
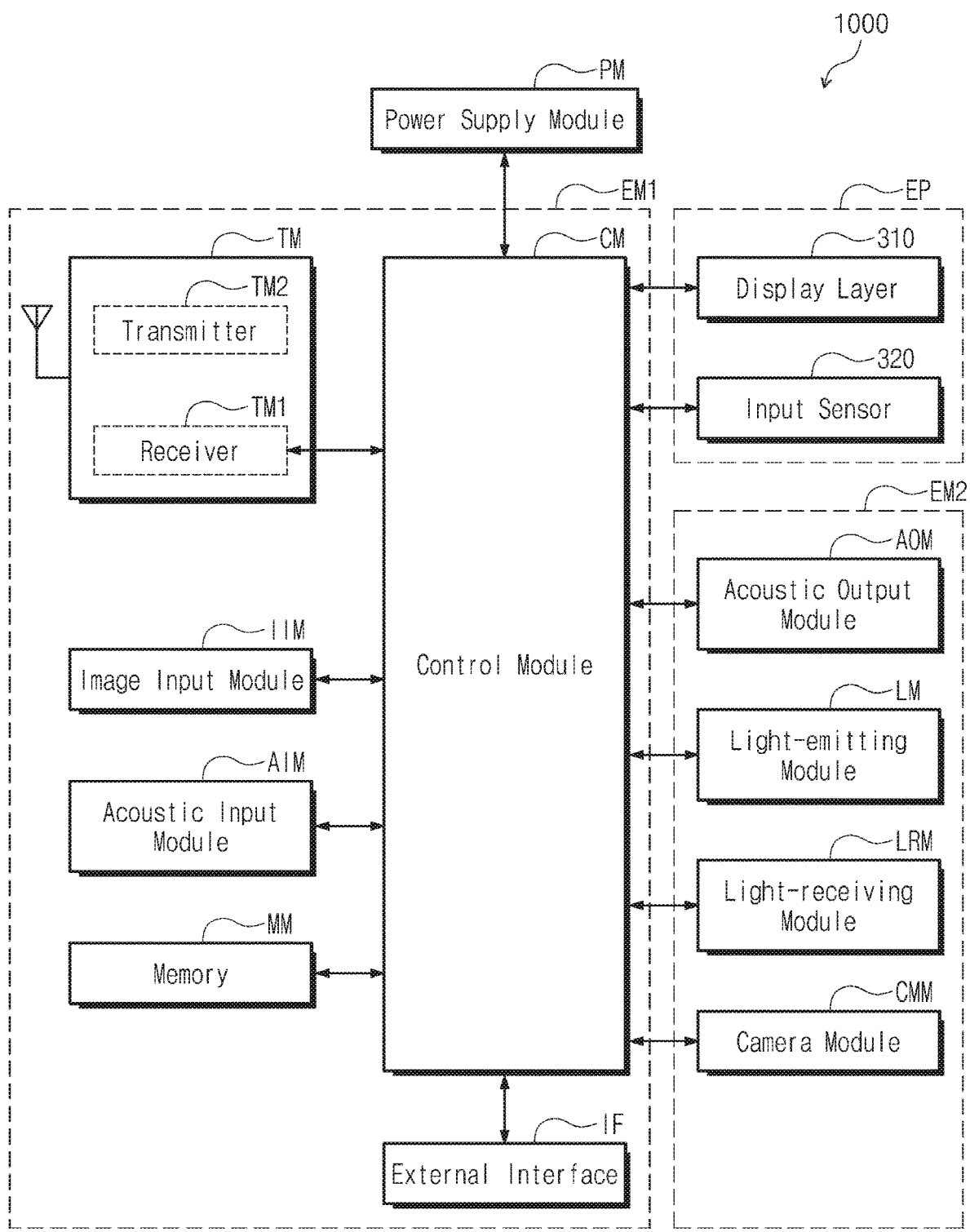
FIG. 2B illustrates a block diagram of the electronic device according to an embodiment.

FIG. 1 illustrates a perspective view showing an electronic device 1000 according to an embodiment. FIG. 2A illustrates an exploded perspective view showing the electronic device 1000 according to an embodiment, and FIG. 2B illustrates a block diagram showing the electronic device 1000 according to an embodiment. The following will describe embodiments of the present invention with reference to FIGS. 1, 2A, and 2B.

The electronic device 1000 may be activated with an electrical signal. The electronic device 1000 may be, for example, a tablet computer, laptop computer, smart television set, or another device. FIG. 1 depicts the electronic device 1000 as a smart phone, but the embodiments of the present invention are not particularly limited thereto.

The electronic device 1000 may display an image IM in a third direction DR3 on a display surface FS parallel to each of a first direction DR1 and a second direction DR2. The display surface FS on which the image IM is displayed may correspond to a front surface of the electronic device 1000 and to a front surface of a window 100. In this description, like reference numerals are allocated to a display surface of the electronic device 1000, a front surface of the electronic device 1000, and a front surface of the window 100. The image IM may include not only dynamic images but also static images. FIG. 1 depicts a clock and a plurality of icons as examples of the image IM.

In an embodiment, front and rear surfaces (or top and bottom surfaces) of each component are indicated based on a direction along which the image IM is displayed. The front and rear surfaces may be opposite to each other in the third direction DR3, and a normal direction to each of the front and rear surfaces may be parallel to the third direction DR3. The spacing distance in the third direction DR3 between the front and rear surfaces may correspond to a thickness in the third direction DR3 of the electronic device 1000. Directions indicated by the first, second, and third directions DR1, DR2, and DR3 may be relative concepts and changed into other directions.

According to an embodiment, the electronic device 1000 may detect a user input TC that is externally applied. The user input TC includes any suitable type of input such as, but not limited to a touch or gesture from a part of the body of a user, light, heat, pressure, a passive pen, or an active pen. As an example, the user input TC is illustrated in FIG. 1 as being from the hand of a user applied to the front surface FS. This, however, is merely illustrated by way of example, and the user input TC may be provided in any of various types as discussed above. Based on its structure, the electronic device 1000 may detect a user input TC applied to a lateral or rear surface thereof, but the embodiments of the present invention are not limited thereto.

Referring to FIG. 2A, the electronic device 1000 may include a window 100, a housing 200, a display module 300, and an electronic module 400. In an embodiment, the window 100 and the housing 200 are coupled to each other to constitute an appearance of the electronic device 1000.

The window 100 may include a dielectric panel. For example, the window 100 may be formed of glass, plastic, or any combination thereof. As discussed above, the front surface FS of the window 100 may correspond to the front surface of the electronic device 1000. The front surface FS of the window 100 may include a transmission region TA and a bezel region BZA. The transmission region TA may be an optically transparent zone. For example, the transmission region TA may be a zone whose visible-light transmittance is equal to or greater than about 90%. The bezel region BZA may be a zone whose optical transmittance is relatively low. The bezel region BZA may provide the shape of the transmission region TA and may be adjacent to or surround the transmission region TA.

The bezel region BZA may have a certain color and, for example, may include a bezel layer provided separately from a transparent substrate corresponding to the transmission region TA, or may include an ink layer inserted into a transparent substrate or formed by being colored. The bezel region BZA may cover a peripheral region NAA of the display module 300 and may prevent the peripheral region NAA from being externally visible. This, however, is merely illustrated by way of example. In one embodiment, the bezel region BZA may be omitted from the window 100.

In an embodiment, a first region A1 may be defined to overlap the transmission region TA. The first region A1 may be a zone of or on a display panel EP, embodiment of which are discussed below. In on embodiment, in a plan view the zone of the first region A1 may overlap the electronic module 400. The electronic device 1000 may receive external signals through the first region A1 for operation of the electronic module 400 and/or may provide signals that are output from the electronic modules 400. According to one embodiment, the first region A1 may overlap the transmission region TA to decrease the area of the bezel region BZA. Embodiments will be discussed below.

The display module 300 may include a display panel EP and a driver circuit IC.

The display panel EP may display the image IM and may detect the external input TC. In one embodiment, the display panel EP has a front surface IS that includes an active region AA and a peripheral region NAA. The active region AA may be a zone activated with an electrical signal. In an embodiment, the active region AA may be a zone that not only displays the image IM but also detects the external input TC. The active region AA may be a zone on which are located a plurality of pixels, embodiments of which are discussed below.

The transmission region TA overlaps at least the active region AA. For example, the transmission region TA overlaps an entirety or at least a portion of the active region AA. Accordingly, a user may recognize the image IM through the transmission region TA or may provide the external input TC through the transmission region TA. This, however, is merely illustrated by way of example. The active region AA may be configured such that an area to display the image IM is separated from an area to detect the external input TC, but the embodiments of the present invention are not limited thereto.

The peripheral region NAA may include a zone covered with the bezel region BZA. The peripheral region NAA may be adjacent to the active region AA and, for example, may surround the active region AA. The peripheral region NAA may include a zone on which the image IM is not displayed. The peripheral region NAA may include one or more driving lines or one or more driver circuits for driving components on or in active region AA.

In an embodiment, the display panel EP may be assembled in such a way that the active region AA is directed toward the window 100 and a portion of the peripheral region NAA is in a bent state. For example, a portion of the peripheral region NAA may be directed toward the rear surface of the electronic device 1000, and thus the bezel region BZA may decrease in area on the front surface of the electronic device 1000. In one embodiment, the display panel EP may be assembled such that a portion of the active region AA is in a bent state. In one embodiment, the peripheral region NAA may be omitted from display panel EP.

The display panel EP may include a flat part FN and a bending part BN. The flat part FN may be assembled to be substantially parallel to a plane oriented in the first direction DR1 and the second direction DR2. The active region AA may be on the flat part FN.

The bending part BN may be bent extending from the flat part FN. The bending part BN may be assembled such that the bending part BN is bent from the flat part FN and is located on a backside of the flat part FN. The bending part BN may overlap the flat part FN in a plan view when the bending part BN is assembled. In such a case, the electronic device 1000 may have a reduced bezel region. This, however, is merely illustrated by way of example. In an embodiment, the bending part BN may be omitted from the display panel EP.

The active region AA of the display panel EP may include a first region A1 and a second region A2. The first region A1 may have a transmittance different from (e.g., greater than) that of the second region A2. The first region A1 may be on a zone that overlaps the electronic module 400 in a plan view. Although the first region A1 is illustrated by way of example as having a circular shape, the first region A1 may have a different shape in another embodiment. Examples include, but are not limited, to a polygonal shape, an oval shape, a shape having at least one curved side, or another shape.

The second region A2 is adjacent to the first region A1. In an embodiment, the second region A2 may have a shape that, for example, completely surrounds an edge of the first region A1. This, however, is merely illustrated by way of example. The second region A2 may be adjacent to a portion of the edge of the first region A1 in another embodiment.

The driver circuit IC may be mounted on the bending part BN. Although the driver circuit IC is illustrated to have a chip shape, the driver circuit IC may be provided on a separate circuit board and electrically connected to the display panel EP, for example, through a flexible film.

The driver circuit IC may be electrically connected with the active region AA and may provide the active region AA with electrical signals. For example, the driver circuit IC may include a data driver circuit and may provide data signals to pixels located on the active region AA. In one example, the driver circuit IC may include a touch driver circuit and may be electrically connected with an input sensor located on the active region AA. This, however, is merely an example. The driver circuit IC may include various circuits other than the circuits mentioned above and/or may be designed to be provided on the active region AA in other embodiments.

In one embodiment, the electronic device 1000 may further include a main circuit board electrically connected to the display panel EP and the driver circuit IC. The main circuit board may include power supply connectors or various driver circuits to drive the display panel EP. The main circuit board may be a rigid printed circuit board (PCB) or a flexible circuit board, but the embodiments of the present invention are not limited to a particular embodiment.

The electronic module 400 is located below the display module 300. In a plan view, the electronic module 400 may overlap the first region A1. The electronic module 400 may receive an external input transferred through the first region A1 or may provide an output through the first region A1. In one embodiment, the active region AA may be provided with the first region A1 having a transmittance that is relatively high. In one case, the electronic module 400 may overlap the active region AA. Accordingly, it may be possible to prevent an increase in area of the bezel region BZA.

Referring back to FIG. 2B, the electronic device 1000 may include a display panel EP, a power supply module PM, a first electronic module EM1, and a second electronic module EM2 which, for example, may be electrically connected to each other.

The display panel EP may include a display layer 310 and an input sensor 320. The display layer 310 may substantially generate the image IM, which may be displayed on the display surface IS through the transmission region TA so that it is externally visible to others. The input sensor 320 may detect the external input TC that is externally applied. As discussed above, the input sensor 320 may detect the external input TC provided to the window 100.

The power supply module PM may supply power for overall operation of the electronic device 1000. The power supply module PM may include, for example, a battery module.

The first electronic module EM1 and the second electronic module EM2 may include various functional modules to operate the electronic device 1000. The first electronic module EM1 may be directly mounted on a motherboard electrically connected to the display panel EP or may be mounted on a separate board that is electrically connected to a motherboard through a connector or the like.

The first electronic module EM1 may include a control module CM, a wireless communication module TM, an image input module IIM, an acoustic input module AIM, a memory MM, and an external interface IF. In one embodiment, one or more of the modules mentioned above may not be mounted on the motherboard, but, for example, may be electrically connected through a flexible circuit board to the motherboard.

The control module CM may control overall operation of the electronic device 1000. The control module CM may include, for example, a microprocessor. For example, the control module CM may activate or deactivate the display module 300. Based on a touch signal received from the display panel EP, the control module CM may control other modules such as the image input module IIM and the acoustic input module AIM.

The wireless communication module TM may use, for example, Bluetooth or WiFi communication to transceive wireless signals with other terminals. The wireless communication module TM may use a communication system to transceive speech signals. The wireless communication module TM may include a transmitter TM1 that modulates and transmits signals to be transferred and may also include a receiver TM2 that demodulates received signals.

The image input module IIM processes and converts image signals to image data for generating images to be displayed on the display panel EP. The acoustic input module AIM receives external sound signals through a microphone in record mode or speech recognition mode, and converts the received sound signals to electrical voice data.

The external interface IF serves as an interface connected to an external charger, a wire/wireless data port, and/or a card socket (e.g., memory card, SIM/UIM card).

The second electronic module EM2 may include an acoustic output module AOM, a light-emitting module LM, a light-receiving module LRM, and a camera module CMM. The components mentioned above may be directly mounted on the motherboard, mounted on a separate board and electrically connected through connectors or the like to the display panel EP, or electrically connected to the first electronic module EM1.

The acoustic output module AOM converts and outputs sound data received from the wireless communication module TM and/or stored in the memory MM.

The light-emitting module LM generates and outputs light. The light-emitting module LM may output, for example, infrared rays. In one embodiment, the light-emitting module LM may include an LED element. The light-receiving module LRM may sense an infrared ray. The light-receiving module LRM may be activated when detecting infrared rays at a certain level or higher. The light-receiving module LRM may include, for example, a CMOS sensor. After output of the infrared rays generated from the light-emitting module LM, the infrared rays may be reflected from an external substance (e.g., finger or face), and the light-receiving module LRM may receive the reflected infrared ray. The camera module CMM captures an external image.

According to an embodiment, the electronic module 400 may include at least one component of the second electronic module EM2. For example, the electronic module 400 may include one or more of a camera, speaker, an optical sensor, or a thermal sensor. The electronic module 400 may receive an external substance transferred through the first region A1 or may externally provide a sound signal (e.g., voice signal) through the first region A1. The electronic module 400 may include one or more additional components, but the embodiments of the present invention are not limited to a particular set of features. The electronic module 400 may be attached to the display panel EP, for example, through a separate adhesive.

Referring back to FIG. 2A, the housing 200 is coupled to the window 100 in such a way as to provide an inner space. The inner space may accommodate the display module 300 and the electronic module 400. The housing 200 may include a material with a rigidity that is relatively high. For example, the housing 200 may include glass, plastics, or metal, or may have a plurality of frames and/or plates including any combination of glass, plastics, and metal. The housing 200 may stably protect, from external impact, components of the electronic device 1000 accommodated in the inner space.

Figure 3:
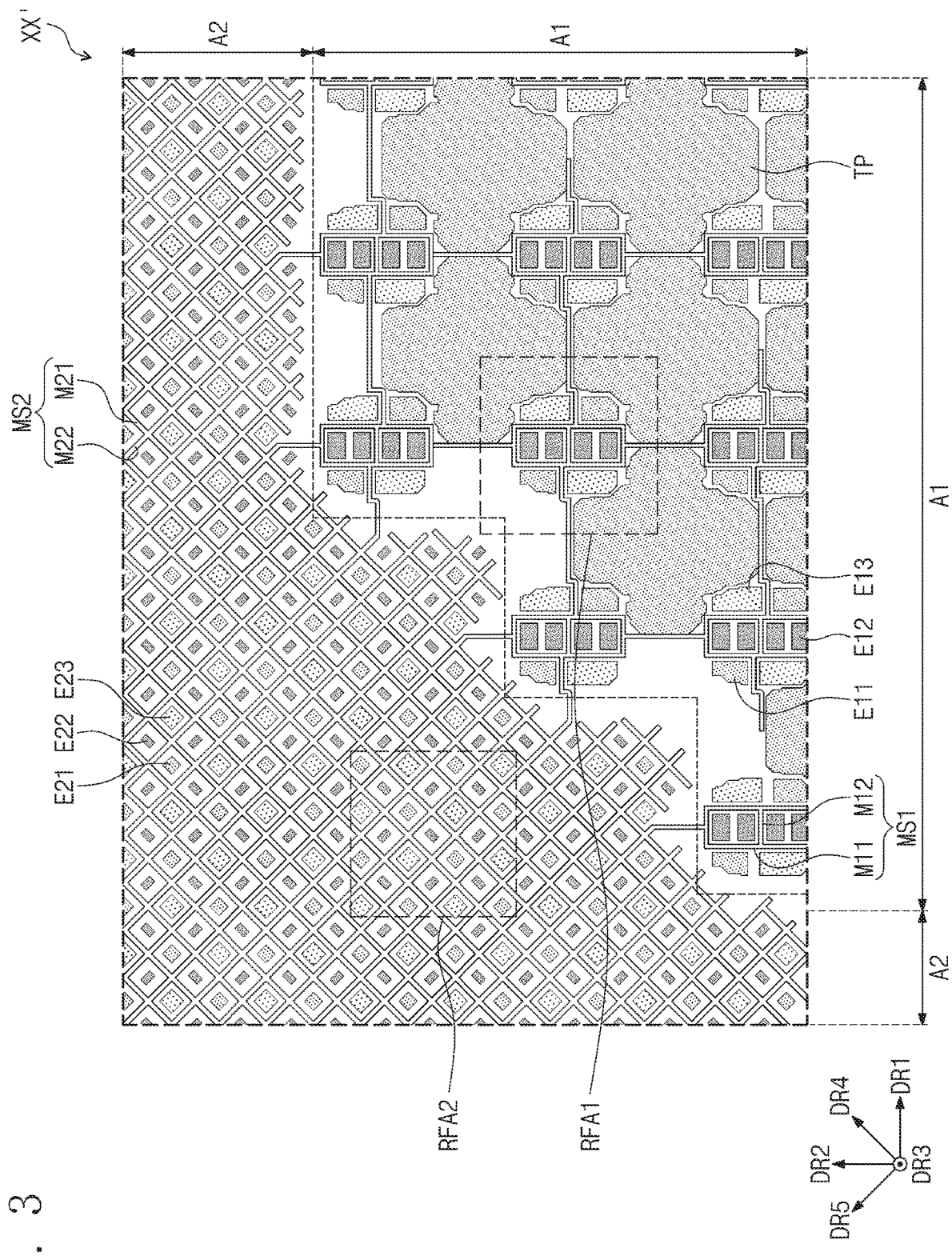
FIG. 3 illustrates a view of the electronic device of FIG. 2A taken along section line XX'.
Figure 4:
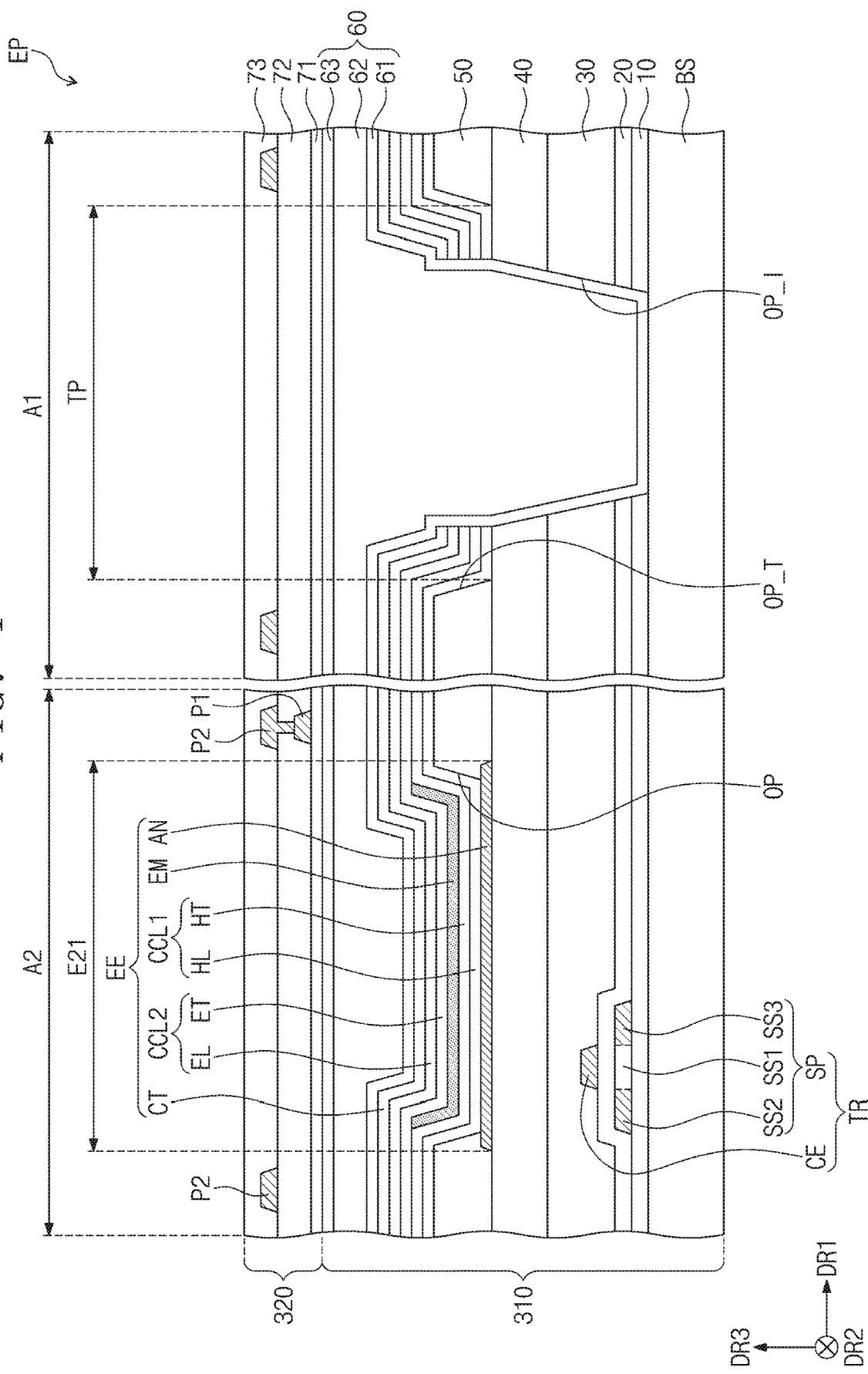
FIG. 4 illustrates an embodiment of a display panel.

FIG. 3 illustrates an embodiment of an enlarged plan view showing section XX' of FIG. 2A. FIG. 4 illustrates a cross-sectional view showing a display panel according to an embodiment. FIG. 3 depicts a portion of the first region A1 and a portion of the second region A2. FIG. 4 shows a cross-section of the first region A1 and a cross-section of the second region A2.

Referring to FIGS. 2A, 3, and 4, the display panel EP may include a plurality of first pixels E11, E12, and E13, a plurality of second pixels E21, E22, and E23, and a plurality of transmission portions TP. The plurality of transmission portions TP may be referred to as a plurality of transmission areas TP. The first pixels E11, E12, and E13 may be located on the first region A1, and the second pixels E21, E22, and E23 may be located on the second region A2. A planar shape of each of the first and second pixels E11, E12, E13, E21, E22, and E23 depicted in FIG. 3 may correspond to an emission area due to a single light emitting element EE.

A first number of first pixels E11, E12, and E13 located on a certain area RFA1 may be less than a second number of the second pixels E21, E22, and E23 located on a certain area RFA2. Therefore, the resolution of the first region A1 may be less than that of the second region A2. The area RFA1 on the first region A1 and the area RFA2 on the second region A2 may be substantially the same in terms of shape and/or size. For example, the first number may be about 8 and the second number may be about 25. This, however, is a mere example to explain a difference in resolution, and the first number and the second number are not limited to the example mentioned above.

The first pixels E11, E12, and E13 may include a first pixel E11 of a first color (e.g., red), a first pixel E12 of a second color (e.g., green), and a first pixel E13 of a third color (e.g., blue). The second pixels E21, E22, and E23 may include a second pixel E21 of the first color, a second pixel E22 of the second color, and a second pixel E23 of the third color. The first, second, and third colors may be different from red, green, and blue in another embodiment.

On the first region A1, two first red pixels E11, four first green pixels E12, and two first blue pixels E13 may be located adjacent to each other. For example, four first green pixels E12 may be arranged along the second direction DR2, and one first red pixel E11 and one blue pixel E13 may be spaced apart in the first direction DR1 from each other across two first green pixels E12. In addition, one first red pixel E11 may be spaced apart in the second direction DR2 from one first blue pixel E13.

The transmission portion TP may be located on the first region A1. In one embodiment, a plurality of transmission portions may be provided and located spaced apart from each other on the first region A1. In one embodiment, a single group may be provided which includes two first red pixels E11, four first green pixels E12, and two first blue pixels E13 discussed above, and the single group may be adjacent to at least one transmission portion TP.

On the second region A2, the second red pixel E21 and the second green pixel E22 may be arranged alternately and repeatedly along each of a fourth direction DR4 and a fifth direction DR5. In addition, on the second region A2, the second blue pixel E23 and the second green pixel E22 may be arranged alternately and repeatedly along each of the fourth direction DR4 and the fifth direction DR5. The fourth direction DR4 may be a direction between the first direction DR1 and the second direction DR2, and the fifth direction DR5 may be a direction that intersects or is orthogonal to the fourth direction DR4. The second red pixels E21 may be spaced apart in the fourth direction DR4 from each other across one second green pixel E22, and the second blue pixels E23 may be spaced apart in the fifth direction DR5 from each other across one second green pixel E22.

On the second region A2, the second red pixel E21 and the second blue pixel E23 may be arranged alternately and repeatedly along each of the first direction DR1 and the second direction DR2. The second green pixels E22 may be arranged alternately and repeatedly one by one along the first direction DR1 and the second direction DR2.

The area of the first red pixel E11 may be greater than that of the second red pixel E21, the area of the first green pixel E12 may be greater than that of the second green pixel E22, and/or the area of the first blue pixel E13 may be greater than that of the second blue pixel E23. This, however, is merely illustrated by way of example, and no limitation is imposed on relationship of the area between the first red, green, and blue pixels E11, E12, and E13 and the second red, green, and blue pixels E21, E22, and E23.

In addition, the shape of the first red pixel E11 may be different from that of the second red pixel E21, the shape of the first green pixel E12 may be different from that of the second green pixel E22, and/or the shape of the first blue pixel E13 may be different from that of the second blue pixel E23. This, however, is merely illustrated by way of example, and no limitation is imposed on relationship of the shape between the first red, green, and blue pixels E11, E12, and E13 and the second red, green, and blue pixels E21, E22, and E23.

FIG. 4 shows an embodiment of a portion of the first region A1 on which is located the transmission portion TP selected from components of the display panel EP and/or a portion of the second region A2 on which is located the second red pixel E21 (also called a pixel hereinafter) selected from components of the display panel EP. Each of the first red, green, and blue pixels E11, E12, and E13 and the second red, green, and blue pixels E21, E22, and E23 may have a stack structure substantially similar to that of the pixel E21, embodiments of which are discussed below.

The display panel EP includes the display layer 310 and the input sensor 320. In an embodiment, the input sensor 320 may be stacked on the display layer 310.

The display layer 310 may include a base substrate BS, a plurality of insulation layers 10, 20, 30, 40, 50, and 60, the pixel E21, and the transmission portion TP. The base substrate BS may be a member that provides a base surface. The base substrate BS may have a multi-layered structure including glass, plastic, a polymer film, an organic layer, and/or an inorganic layer, but the embodiments described herein are not particularly limited thereto. The insulation layers 10, 20, 30, 40, 50, and 60 may include first to sixth insulation layers 10, 20, 30, 40, 50, and 60 stacked on the base substrate BS. The first to sixth insulation layers 10, 20, 30, 40, 50, and 60 may each be one or more of an inorganic layer and an organic layer and each may have a single-layered or multi-layered structure. The display layer 310 may further include an additional insulation layer in addition to the first to sixth insulation layers 10 to 60 or may exclude at least one selected from the first to sixth insulation layers 10 to 60.

The pixel E21 may include first to seventh transistors (e.g., T1 to T7 of FIG. 8), a capacitor (e.g., Cst of FIG. 8), and a light emitting element EE. FIG. 4 depicts the light emitting element EE and one transistor TR. The light emitting element EE may be electrically connected to the transistor TR. The transistor TR may include a semiconductor pattern SP and a control electrode CE. The semiconductor pattern SP may be located between the first insulation layer 10 and the second insulation layer 20.

The semiconductor pattern SP may include a channel part SS1, an input part SS2, and an output part SS3. The channel part SS1, the input part SS2, and the output part SS3 may be divided segments of the semiconductor pattern SP in a plan view. The channel part SS1 may have conductivity less than that of the input part SS2 and the output part SS3.

In an embodiment, the input part SS2 and the output part SS3 may include reduced metal. The input part SS2 and the output part SS3 may serve as a source electrode and a drain electrode of the transistor TR. This, however, is merely explained by way of example. The transistor TR may further include a separate source electrode and a separate drain electrode in contact with the input part SS2 and the output part SS3, but the embodiments described herein are not limited to a particular embodiment.

The control electrode CE has conductivity and may be spaced apart from the semiconductor pattern SP across the second insulation layer 20. In a plan view, the control electrode CE may overlap the channel part SS1 of the semiconductor pattern SP.

The light emitting element EE includes a first electrode AN, a second electrode CT, an emission pattern EM, and charge control layers CCL1 and CCL2. The charge control layers CCL1 and CCL2 may include a first charge control layer CCL1 and a second charge control layer CCL2. The first electrode AN may be located between the fourth insulation layer 40 and the fifth insulation layer 50. At least a portion of the first electrode AN may be exposed by a first opening OP defined in the fifth insulation layer 50. The shape of each of the first and second pixels E11, E12, E13, E21, E22, and E23 may correspond to that of the first electrode AN exposed by the first opening OP.

The emission pattern EM may be located on a zone on which the first opening OP is defined. For example, in a plan view, the emission pattern EM may overlap the first electrode AN exposed by the first opening OP. The emission pattern EM may include a low molecular or high molecular organic luminous material, and may have fluorescence or phosphorescence. In one embodiment, the emission pattern EM may include an inorganic luminous material, e.g., quantum dot, quantum rod, nano-rod, micro-LED, or nano-LED. According to an embodiment, the emission pattern EM may include any suitable luminous material capable of generating light and the embodiments of the present invention are not limited to a particular embodiment.

The second electrode CT may be located on the emission pattern EM and opposite to the first electrode AN. The second electrode CT may be formed as a single piece on an entirety or a portion of the display panel EP. This, however, is merely illustrated by way of example. Similarly to the first electrode AN, the second electrode CT may be patterned to correspond to each pixel E21, but the embodiments of the present invention are not limited to a particular set of features.

The first charge control layer CCL1 may be located between the first electrode AN and the emission pattern EM. The first charge control layer CCL1 may include a hole injection region (or hole injection layer HL) and a hole transport region (or hole transport layer HT). In an embodiment, the first charge control layer CCL1 is illustrated to include the hole injection layer HL and the hole transport layer HT. An open mask may be used to form the first charge control layer CCL1 as a common layer on the entirety or a portion of the display panel EP.

The second charge control layer CCL2 is located between the emission pattern EM and the second electrode CT. The second charge control layer CCL2 may include an electrode injection region (or electrode injection layer EL) and an electrode transport region (or electron transport layer ET). In an embodiment, the second charge control layer CCL2 is illustrated to include the electron injection layer EL and the electron transport layer ET. An open mask may be used to form the second charge control layer CCL2 as a common layer on the entirety or a portion of the display panel EP.

In a plan view, the transmission portion TP may be located spaced apart from the first red, green, and blue pixels E11, E12, and E13. The transmission portion TP may be on a second opening OP_T in the fifth insulation layer 50. On the first region A1, the second opening OP_T may be formed to be spaced apart from the first opening OP.

At least a portion of the first to fifth insulation layers 10, 20, 30, 40, and 50 may be removed from a zone that corresponds to the transmission portion TP. The first to fourth insulation layers 10, 20, 30, and 40 may have an opening OP_I that is formed to expose the base substrate BS. The transmission portion TP with relatively high transmittance may be formed by removing the emission pattern EM and the second electrode CT from the opening OP_I. In an embodiment, the first to fifth insulation layers 10, 20, 30, 40, and 50 may be removed through the opening OP_I and an opening OP_T, and layers included in the light emitting element EE may also be removed, with the result that the transmission portion TP may have transmittance relatively greater than that of the pixel E21. This, however, is merely explained by way of example.

If the transmission portion TP has greater transmittance than that of the pixel E21, the transmission portion TP may further include at least one of the charge control layers CCL1 and CCL2, a portion of the first to fifth insulation layers 10 to 50, or the second electrode CT, but the embodiments of the present invention are not limited to a particular set of features.

The sixth insulation layer 60 is located on the fifth insulation layer 50 and formed on the first region A1 and the second region A2. The sixth insulation layer 60 may be an encapsulation layer. The sixth insulation layer 60 may include a first inorganic layer 61, an organic layer 62, and a second inorganic layer 63. This, however, is not limited thereto, and the sixth insulation layer 60 may further include a plurality of inorganic layers and a plurality of organic layers.

The first inorganic layer 61 may cover the second electrode CT. In addition, the first inorganic layer 61 may cover inner surfaces of the openings OP_T and OP_I on the first region A1. The first inorganic layer 61 may prevent introduction of external moisture or oxygen into the light emitting element EE. For example, the first inorganic layer 61 may include silicon nitride, silicon oxide, or any combination thereof. The first inorganic layer 61 may be formed by a deposition process.

The organic layer 62 may be located on and in contact with the first inorganic layer 61. The organic layer 62 may provide the first inorganic layer 61 with a planar surface. The organic layer 62 covers an undulation formed on a top surface of the first inorganic layer 61 or particles present on the top surface of the first inorganic layer 61. Thus, a state of the top surface of the first inorganic layer 61 may not be allowed to affect components formed on the organic layer 62.

Therefore, in one embodiment the first region A1 or the second region A2 may have a substantially flat top surface. In addition, the organic layer 62 may relieve stress between layers that are in contact with each other. The organic layer 62 may include an organic material and, for example, may be formed by a solution process such as spin coating, slit coating, or inkjet coating.

The second inorganic layer 63 may be located on and cover the organic layer 62 and may be relatively more stably formed on a flat surface than on the first inorganic layer 61. The second inorganic layer 63 may include, for example, silicon nitride, silicon oxynitride, silicon oxide, or any combination thereof. The second inorganic layer 63 may be formed by a deposition process or another process.

The input sensor 320 may be located on the sixth insulation layer 60 and may detect an externally applied input. The input sensor 320 may include, for example, an external sensor attached to the display layer 310 or an internal sensor formed in series in fabricating the display layer 310.

In one embodiment, the input sensor 320 may include a base insulation layer 71, a sensing insulation layer 72, a cover insulation layer 73, a first conductive layer P1, and a second conductive layer P2. The base insulation layer 71 may be an inorganic layer including, for example, silicon nitride, silicon oxynitride, silicon oxide or a combination thereof. In one embodiment, the base insulation layer 71 may be an organic layer including an epoxy-based resin, an acryl-based resin, or an imide-based resin. The base insulation layer 71 may have a single-layered structure or a multi-layered structure in which layers are stacked along the third direction DR3.

Each of the first and second conductive layers P1 and P2 may have a single-layered structure or a multi-layered structure in which layers are stacked along the third direction DR3. The single-layered conductive layer may include a metal layer or a transparent conductive layer. Examples of the metal layer include molybdenum, silver, titanium, copper, aluminum, and alloys thereof. Examples of the transparent conductive layer include transparent conductive oxide, such as indium tin oxide (ITO), indium zinc oxide (IZO), zinc oxide (ZnO), or indium zinc tin oxide (IZTO). Additionally, or alternatively, the transparent conductive layer may include a metal nano-wire, graphene, or conductive polymer such as PEDOT.

The multi-layered conductive layer may include metal layers. The metal layers may include, for example, tri-layered structure of titanium/aluminum/titanium. The multi-layered conductive layer may include at least one metal layer and at least one transparent conductive layer.

Each of the first and second conductive layers P1 and P2 may have an opening that does not overlap the transmission portion TP or the pixel E21. Therefore, even when the first and second conductive layers P1 and P2 are optically opaque, neither the first conductive layer P1 nor the second conductive layer P2 may affect luminance at the pixel E21 or transmittance at the transmission portion TP. This, however, is merely illustrated by way of example. When the first and second conductive layers P1 and P2 are optically transparent, the first and second conductive layers P1 and P2 may overlap the transmission portion TP and the pixel E21 in a plan view, but the embodiments of the present invention are not limited to a particular set of features.

At least one of the sensing insulation layer 72 or the cover insulation layer 73 may include an inorganic layer. The inorganic layer may include at least one of aluminum oxide, titanium oxide, silicon oxide, silicon nitride, silicon oxynitride, zirconium oxide, or hafnium oxide. At least one of the sensing insulation layer 72 or the cover insulation layer 73 may include at least one organic layer. The organic layer may include at least one of an acryl-based resin, methacryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

Referring back to FIG. 3, mesh lines MS1 and MS2 are illustrated which are included in the input sensor 320. For example, the mesh lines MS1 and MS2 may be included in the first conductive layer P1 or the second conductive layer P2. The mesh lines MS1 and MS2 may define openings that correspondingly overlap the first red pixel E11, the first green pixel E12, the first blue pixel E13, the second red pixel E21, the second green pixel E22, and the second blue pixel E23. In one embodiment, the mesh lines MS1 and MS2 may shapes that surround the first red pixel E11, the first green pixel E12, the first blue pixel E13, the second red pixel E21, the second green pixel E22, and the second blue pixel E23.

First mesh lines MS1 located on the first region A1 may provide an opening having sizes different from those of openings defined by second mesh lines MS2 located on the second region A2. As discussed above, sub-emission patterns E11M, E12M, and E13M on the first region A1 may have sizes and arrangements different from those of sub-emission patterns E21M, E22M, and M23M on the second region A2. Accordingly, the first mesh lines MS1 may have shapes different from those of the second mesh lines MS2.

The first red, green, and blue pixels E11, E12, and E13 on the first region A1 may be arranged in a spaced-apart configuration relative to each other in the first direction DR1 and the second direction DR2. In one embodiment, the first mesh lines MS1 may be formed of first conductive lines M11 that extend along the first direction DR1 and second conductive lines M12 that extend along the second direction DR2.

The second red, green, and blue pixels E21, E22, and E23 on the second region A2 may be arranged in a spaced-apart configuration relative to each other in the fourth direction DR4 and the fifth direction DR5. In one embodiment, the second mesh lines MS2 may be formed of third conductive lines M21 that extend along the fourth direction DR4 and fourth conductive lines M22 that extend along the fifth direction DR5.

In one embodiment, the extending directions of the first mesh lines MS1 and the second mesh lines MS2 may be different from each other, for example, in accordance with arrangement directions of the first red, green, and blue pixels E11, E12, and E13 and the second red, green, and blue pixels E21, E22, and E23. This, however, is merely illustrated by way of example. In one embodiment, the first mesh lines MS1 and the second mesh lines MS2 may be formed of conductive lines that extend in substantially the same direction, for example, in accordance with arrangement directions of the first red, green, and blue pixels E11, E12, and E13 and the second red, green, and blue pixels E21, E22, and E23.

Figure 5:
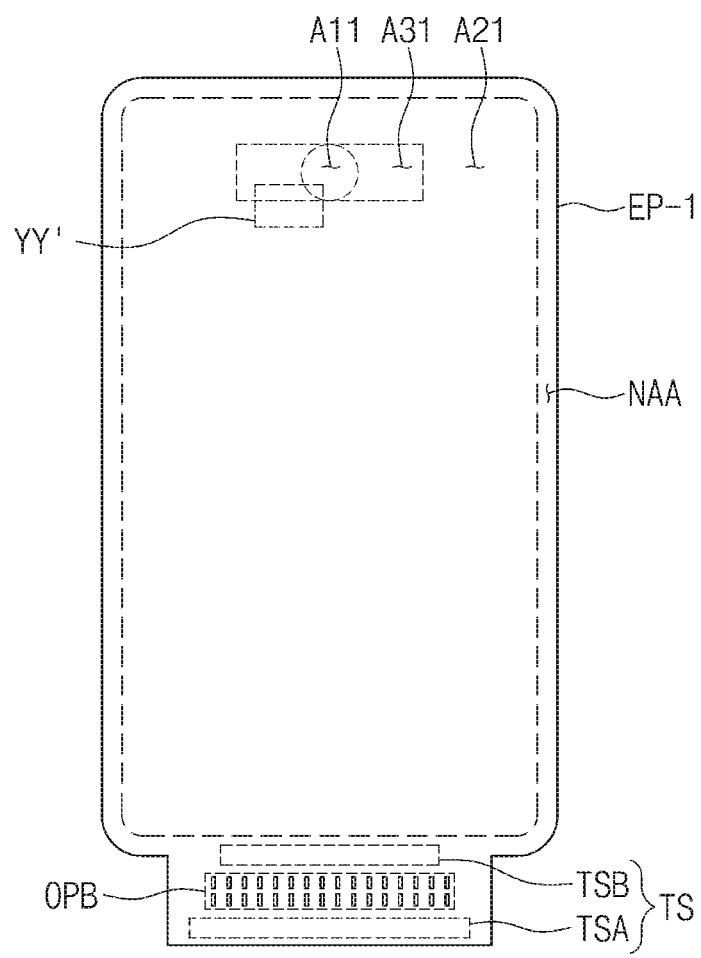
FIG. 5 illustrates an embodiment of a display panel.
Figure 6:
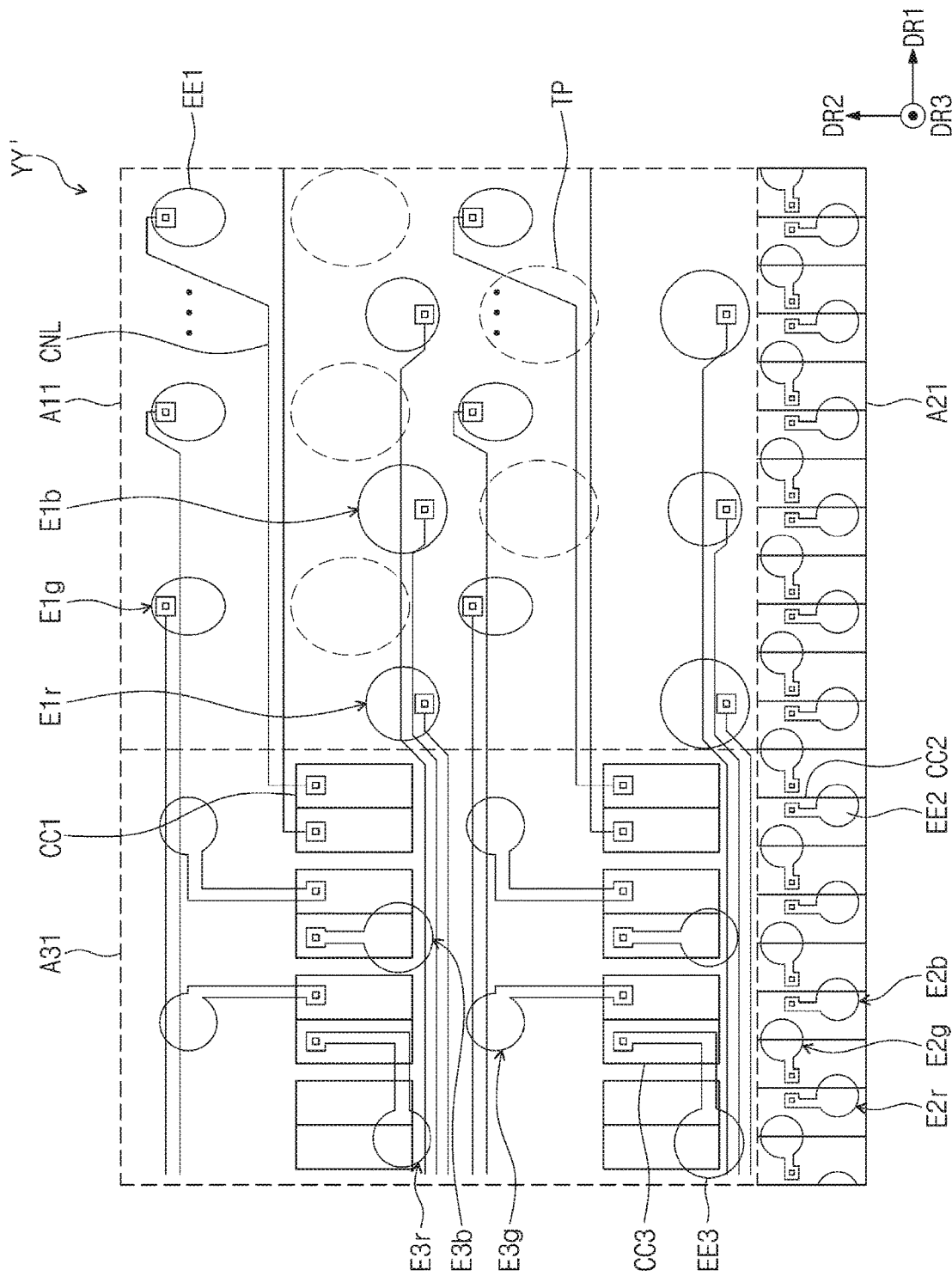
FIG. 6 illustrates a view of the display panel of FIG. 5 along section line YY'.

FIG. 5 illustrates a plan view showing a display panel according to an embodiment. FIG. 6 illustrates an enlarged plan view showing section YY' of FIG. 5.

Referring to FIGS. 5 and 6, a display panel EP-1 may include a first region A11 and a second region A21, and may further include a third region A31 defined between the first region A11 and the second region A21.

The first region A11 may be on a zone that overlaps the electronic module (e.g., 400 of FIG. 2A) in a plan view. Although the first region A11 is illustrated by way of example as having a circular shape, the first region A11 may have a polygonal shape, an oval shape, a shape having at least one curved side, or another shape. The third region A31 is adjacent to the first region A11 and, in one embodiment, may surround at least a portion of the first region A11.

The third region A31 may be spaced apart from the peripheral region NAA. Therefore, the third region A31 may be completely surrounded by the second region A21 in an embodiment. This, however, is not limited thereto, and the third region A31 may be in contact with the peripheral region NAA. In this case, for example, the second region A21 may surround only a portion of the third region A31.

In one embodiment, the resolution of the third region A31 may be less than that of the second region A21. The resolution of the third region A31 may be substantially the same as or greater than that of the first region A11. The transmittance of the third region A31 may be less than that of the first region A11. The transmittance of the third region A31 may be substantially the same as or greater than that of the second region A21.

The display panel EP-1 may include first pixels E1$r$, E1$g$, and E1$b$, second pixels E2$r$, E2$g$, and E2$b$, and third pixels E3$r$, E3$g$, and E3$b$. The first pixels E1$r$, E1$g$, and E1$b$ may include a first red pixel E1$r$, a first green pixel E1$g$, and a first blue pixel E1$b$. The second pixels E2$r$, E2$g$, and E2$b$ may include a second red pixel E2$r$, a second green pixel E2$g$, and a second blue pixel E2$b$. The third pixels E3$r$, E3$g$, and E3$b$ may include a third red pixel E3$r$, a third green pixel E3$g$, and a third blue pixel E3$b$. The pixels may output light of different colors in another embodiment.

Each of the first pixels E1$r$, E1$g$, and E1$b$ may include a first light emitting element EE1 and a first pixel circuit CC1 that drives the first light emitting element EE1. Each of the second pixels E2$r$, E2$g$, and E2$b$ may include a second light emitting element EE2 and a second pixel circuit CC2 that drives the second light emitting element EE2. Each of the third pixels E3$r$, E3$g$, and E3$b$ may include a third light emitting element EE3 and a third pixel circuit CC3 that drives the third light emitting element EE3.

The first light emitting element EE1 may be located on the first region A11, the second light emitting element EE2 may be located on the second region A21, and the third light emitting element EE3 may be located on the third region A31. The first pixel circuit CC1 may be located on the third region A31 or the peripheral region NAA. The second pixel circuit CC2 may be located on the second region A21. The third pixel circuit CC3 may be located on the third region A31.

The first region A11 may include a zone that overlaps the electronic module 400. The first circuit CC1, for driving the first light emitting element EE1 on the first region A11, may be located on a region other than the first region A11, for example, may be located on the third region A31 or the peripheral region NAA. For example, when the first pixel circuit CC1 is not located on the first region A11, it may be easy to increase the area of the transmission portion TP and accordingly to improve optical transmittance.

The first light emitting element EE1 and the first pixel circuit CC1 may be electrically connected to each other through a connection line CNL. The connection line CNL may overlap the transmission portions TP. The connection line CNL may include a transparent conductive line. The transparent conductive line may include a transparent conductive material. For example, the transparent conductive line may include a transparent conductive oxide (TCO) layer including IGZO, ITO, IZO, ZnO, or In$_2$O$_3$.

The third region A31 may not include the transmission portions TP, and the first pixel circuit CC1 may be located on the third region A31. Therefore, the number of the third light emitting elements EE3 located on the third region A31 per unit area may be less than that of the second light emitting elements EE2 located on the second region A21.

Figure 7:
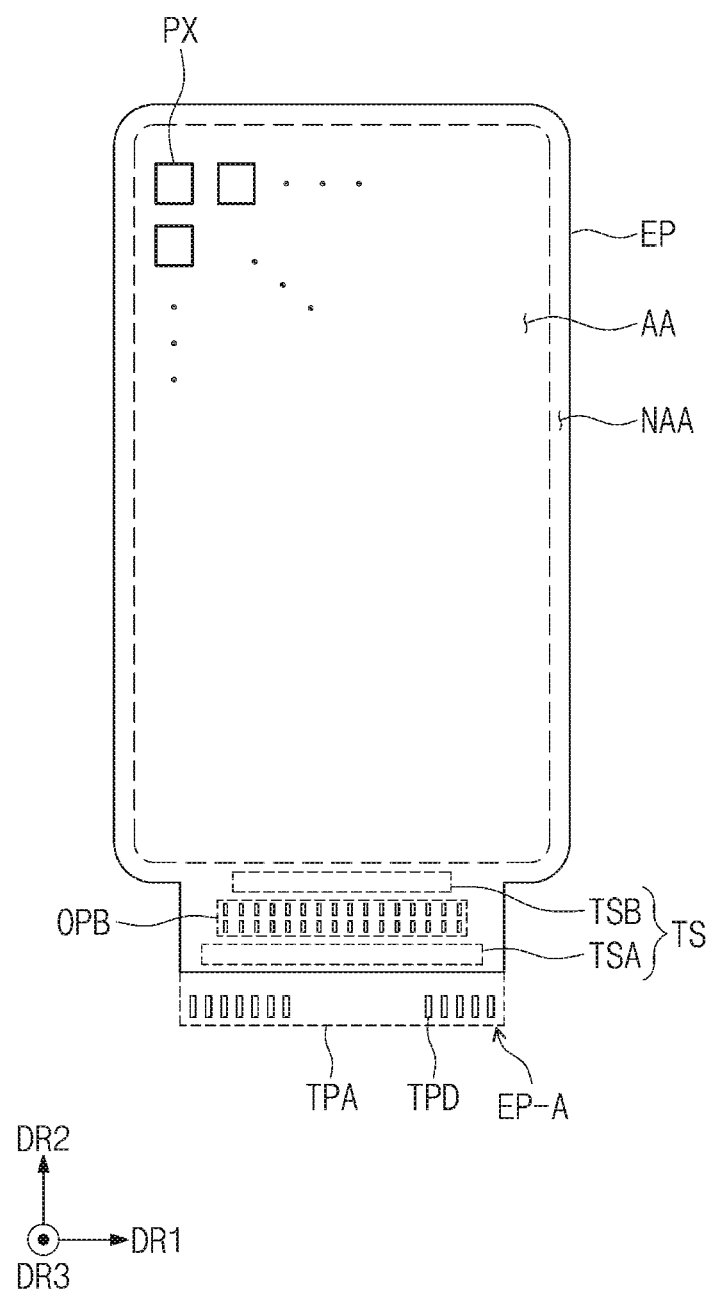
FIG. 7 illustrates an embodiment of a display panel.

FIG. 7 illustrates a plan view showing a display panel according to an embodiment. Referring to FIG. 7, the display panel EP may include pixels PX located on the active region AA, a test part TS located on the peripheral region NAA, and a plurality of bumps OPB located on the peripheral region NAA.

The pixels PX may include the first pixels E11, E12, and E13 and the second pixels E21, E22, and E23 as discussed above with respect to FIG. 3. In one embodiment, the pixels PX may include the first pixels E1$r$, E1$g$, and E1$b$, the second pixels E2r, E2g, and E2b, and the third pixels E3r, E3g, and E3b discussed above in FIG. 6. The bumps OPB may be attached thereto with the integrated circuit IC, for example, in the form of a chip as depicted in FIG. 2B.

The test part TS may include a first test part TSA and a second test part TSB. Each of the first test part TSA and the second test part TSB may include a circuit that applies a test voltage for testing the pixels PX. Embodiments of the first test part TSA and the second test part TSB are described below. The test part TS may be referred to as a test circuit TS. The first test part TSA and The second test part TSB may be referred to as a first test circuit TSA and a second test circuit TSB, respectively.

In one embodiment, the first test part TSA and the second test part TSB may be spaced apart from each other across the bumps OPB, but the embodiments of the present invention are not particularly limited thereto. The first test part TSA and the second test part TSB may have positions that are changed on the peripheral region NAA. The first test part TSA and the second test part TSB may be electrically connected to test pads TPD located on a test pad area TPA. For example, the formation of the display panel EP may include testing a display panel EP-A by providing test voltages to the first pixels E11, E12, and E13 and the second pixels E21, E22, and E23 of the display panel EP-A. A portion of the display panel EP-A may then be cut after testing the display panel EP-A. Cutting the portion of the display panel EP-A may include cutting and removing the test pad area TPA on which the test pads TPD are mounted.

Figure 8:
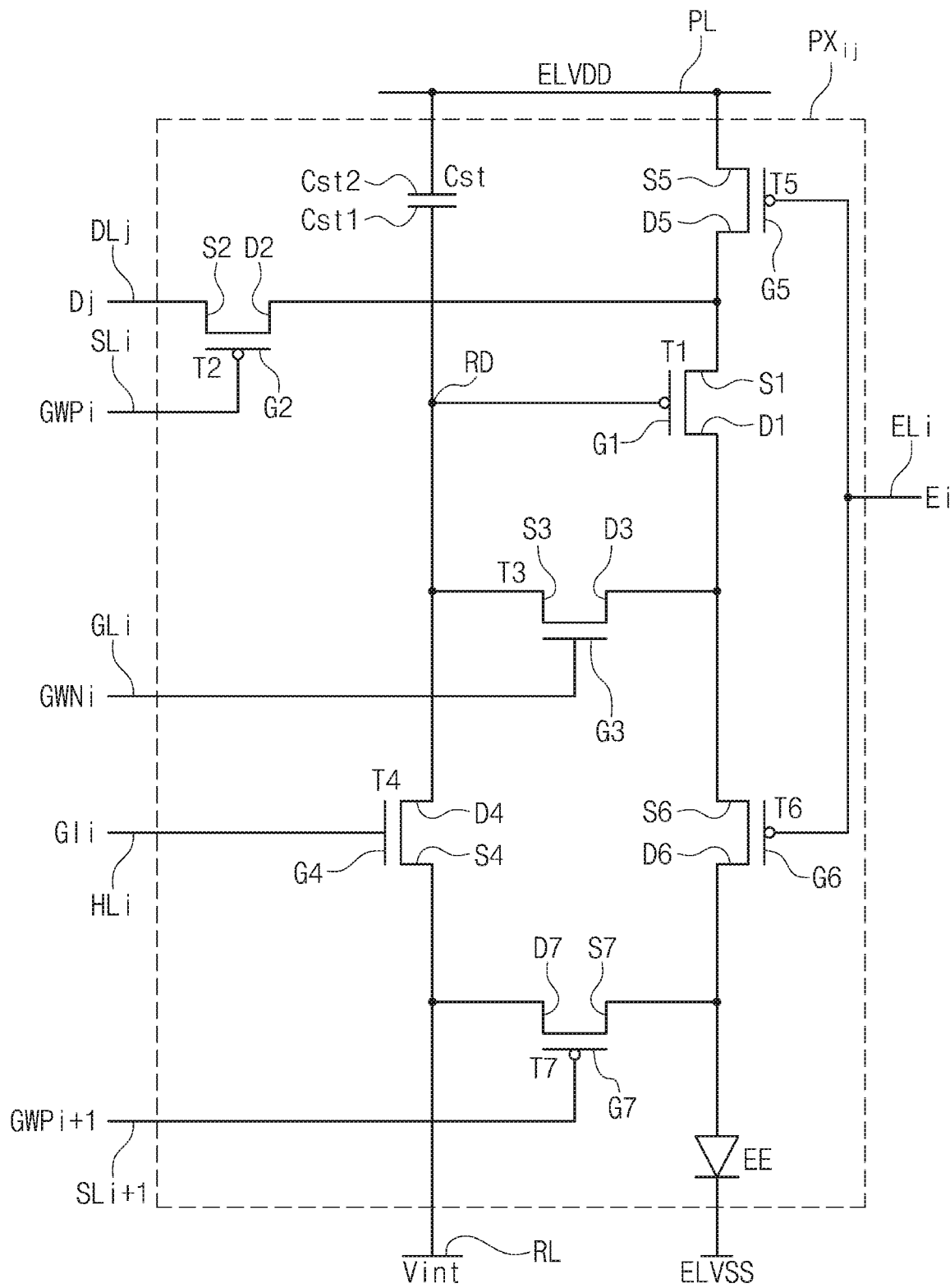
FIG. 8 illustrates an embodiment of a pixel.
Figure 9:
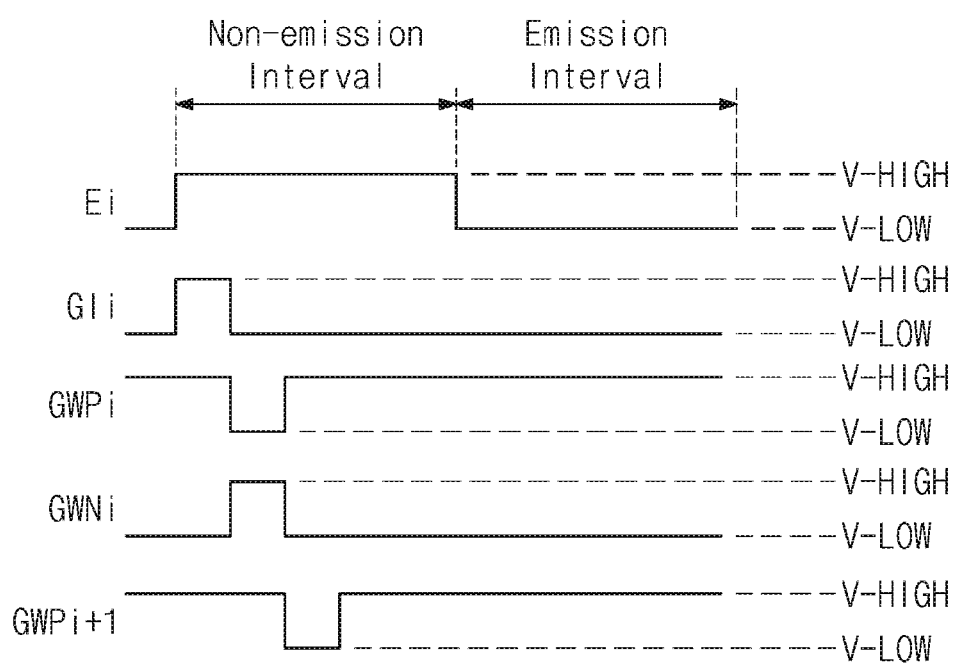
FIG. 9 illustrates an embodiment of driving signals for the pixel.

FIG. 8 illustrates an embodiment of an equivalent circuit diagram of a pixel, and FIG. 9 illustrates a timing diagrams including an embodiment of driving signal waveforms for driving the pixel of FIG. 8. For illustrative purposes, FIGS. 8 and 9 depict a representative pixel PXij, which is connected to a $j^{th}$ data line DLj, an $i^{th}$ first scan line SLi, an $i^{th}$ second scan line GLi, and an $i^{th}$ third scan line HLi.

In an embodiment, the pixel PXij may include first to seventh transistors T1 to T7, a capacitor Cst, and a light emitting element EE. In an embodiment, the first, second, fifth, sixth, and seventh transistors T1, T2, T5, T6, and T7 may be P-type transistors, and the third and fourth transistors T3 and T4 may be N-type transistors. The embodiments of the present invention, however, are not limited thereto. For example, the first to seventh transistors T1 to T7 may be implemented as P-type transistors, N-type transistors, or a combination thereof different from the combination discussed above. In an embodiment, at least one of the first to seventh transistors T1 to T7 may be omitted.

In an embodiment, the first transistor T1 may be a driving transistor and the second transistor T2 may be a switching transistor. The capacitor Cst may be coupled between a reference node RD and a first voltage line PL that receives a first power voltage ELVDD. The capacitor Cst includes a first electrode Cst1 coupled to the reference node RD and a second electrode Cst2 coupled to the first voltage line PL.

The first transistor T1 is coupled between the first voltage line PL and one electrode of the light emitting element EE. A source S1 of the first transistor T1 is electrically connected to the first voltage line PL. (In one embodiment, the phrase "electrically connected between a transistor and a signal line or between a transistor and a transistor" may include the case where the source, drain, or gate of the transistor is integrally formed with the signal line or is connected through a connection electrode to the signal line.) In one embodiment, a transistor such as the fifth transistor T5 may be located or omitted between the first voltage line PL and the source S1 of the first transistor T1.

A drain D1 of the first transistor T1 is electrically connected to an anode of the light emitting element EE. A transistor such as the sixth transistor T6 may be located or omitted between the drain D1 of the first transistor T1 and the anode of the light emitting element EE. A gate G1 of the first transistor T1 is electrically connected to the reference node RD.

The second transistor T2 is coupled between the $j^{th}$ data line DLj and the source S1 of the first transistor T1. A source S2 of the second transistor T2 is electrically connected to the $j^{th}$ data line DLj, and a drain D2 of the second transistor T2 is electrically connected to the source S1 of the first transistor T1. In an embodiment, a gate G2 of the second transistor T2 may be electrically connected to the $i^{th}$ first scan line SLi.

The third transistor T3 is coupled between the reference node RD and the drain D1 of the first transistor T1. A drain D3 of the third transistor T3 is electrically connected to the drain D1 of the first transistor T1, and a source S3 of the third transistor T3 is electrically connected to the reference node RD. A gate G3 of the third transistor T3 may be electrically connected to the $i^{th}$ second scan line GLi.

The fourth transistor T4 is coupled between the reference node RD and a second voltage line RL. A drain D4 of the fourth transistor T4 is electrically connected to the reference node RD, and a source S4 of the fourth transistor T4 is electrically connected to the second voltage line RL. A gate G4 of the fourth transistor T4 may be electrically connected to the $i^{th}$ third scan line HLi.

The fifth transistor T5 is coupled between the first voltage line PL and the source S1 of the first transistor T1. A source S5 of the fifth transistor T5 is electrically connected to the first voltage line PL, and a drain D5 of the fifth transistor T5 is electrically connected to the source S1 of the first transistor T1. A gate G5 of the fifth transistor T5 may be electrically connected to the $i^{th}$ emission control line ELi.

The sixth transistor T6 is coupled between the light emitting element EE and the drain D1 of the first transistor T1. A source S6 of the sixth transistor T6 is electrically connected to the drain D1 of the first transistor T1, and a drain D6 of the sixth transistor T6 is electrically connected to the anode of the light emitting element EE. A gate G6 of the sixth transistor T6 may be electrically connected to the $i^{th}$ emission control line ELi. In an embodiment of the present invention, the gate G6 of the sixth transistor T6 may be connected to another signal line other than the gate G5 of the fifth transistor T5.

The seventh transistor T7 is coupled between the second voltage line RL and the drain D6 of the sixth transistor T6. A source S7 of the seventh transistor T7 is electrically connected to the drain D6 of the sixth transistor T6, and a drain D7 of the seventh transistor T7 is electrically connected to the second voltage line RL. A gate G7 of the seventh transistor T7 may be electrically connected to an $(i+)^{th}$ first scan line SLi+1.

The following will focus on a detailed operation of the pixel PXij with reference to FIGS. 8 and 9. The display panel (e.g., EP of FIG. 7) may display an image at each frame interval. Each of the first scan line SLi, the second scan line GLi, the third scan line HLi, and the emission control line Eli is provided in plurality, and these signal lines may be sequentially scanned.

FIG. 9 depicts a portion of one frame interval according to one embodiment.

Referring to FIG. 9, each of signals Ei, Gli, GWPi, GWNi, and GWPi+1 may have a logically high level V-HIGH for a certain interval and a logically low level V-LOW for another certain interval. N-type transistors are turned on when corresponding signals have their high levels V-HIGH, and P-type transistors are turned on when corresponding signals have their low levels V-LOW.

When an emission control signal Ei has a high level V-HIGH, the fifth transistor T5 and the sixth transistor T6 are turned off. When the fifth and sixth transistors T5 and T6 are turned off, no current path is formed between the first voltage line PL and the light emitting element EE. Therefore, an interval related thereto may correspond to a non-emission interval.

When a high level V-HIGH is assumed by a first scan signal GIi applied to the $i^{th}$ third scan line HLi, the fourth transistor T4 is turned on. When the fourth transistor T4 is turned on, an initialization voltage Vint initializes the reference node RD.

When a low level V-LOW is assumed by a second scan signal GWPi applied to the $i^{th}$ first scan line SLi, and when a high level V-HIGH is assumed by a third scan signal GWNi applied to the $i^{th}$ second scan line GLi, the second transistor T2 and the third transistor T3 are turned on.

When the reference node RD is initialized due to the initialization voltage Vint, the first transistor T1 is in a turn-on state. When the first transistor T1 is turned on, the reference node RD is provided with a voltage that corresponds to a data signal Dj. In this case, the capacitor Cst stores the voltage that corresponds to the data signal Dj.

When a low level V-LOW is assumed by a fourth scan signal GWPi+1 applied to the $(i+1)^{th}$ first scan line SLi+1, the seventh transistor T7 is turned on. As the seventh transistor T7 is turned on, the anode of the light emitting element EE is initialized into the initialization voltage Vint. In this case, a parasitic capacitor of the light emitting element EE may be discharged.

When the emission control signal Ei has a low level V-LOW, the fifth transistor T5 and the sixth transistor T6 are turned on. When the fifth transistor T5 is turned on, the first transistor T1 is provide with the first power voltage ELVDD. When the sixth transistor T6 is turned on, the first transistor T1 is electrically coupled to the light emitting element EE. The light emitting element EE may generate light with brightness that corresponds to an amount of current provided thereto.

Figure 10:
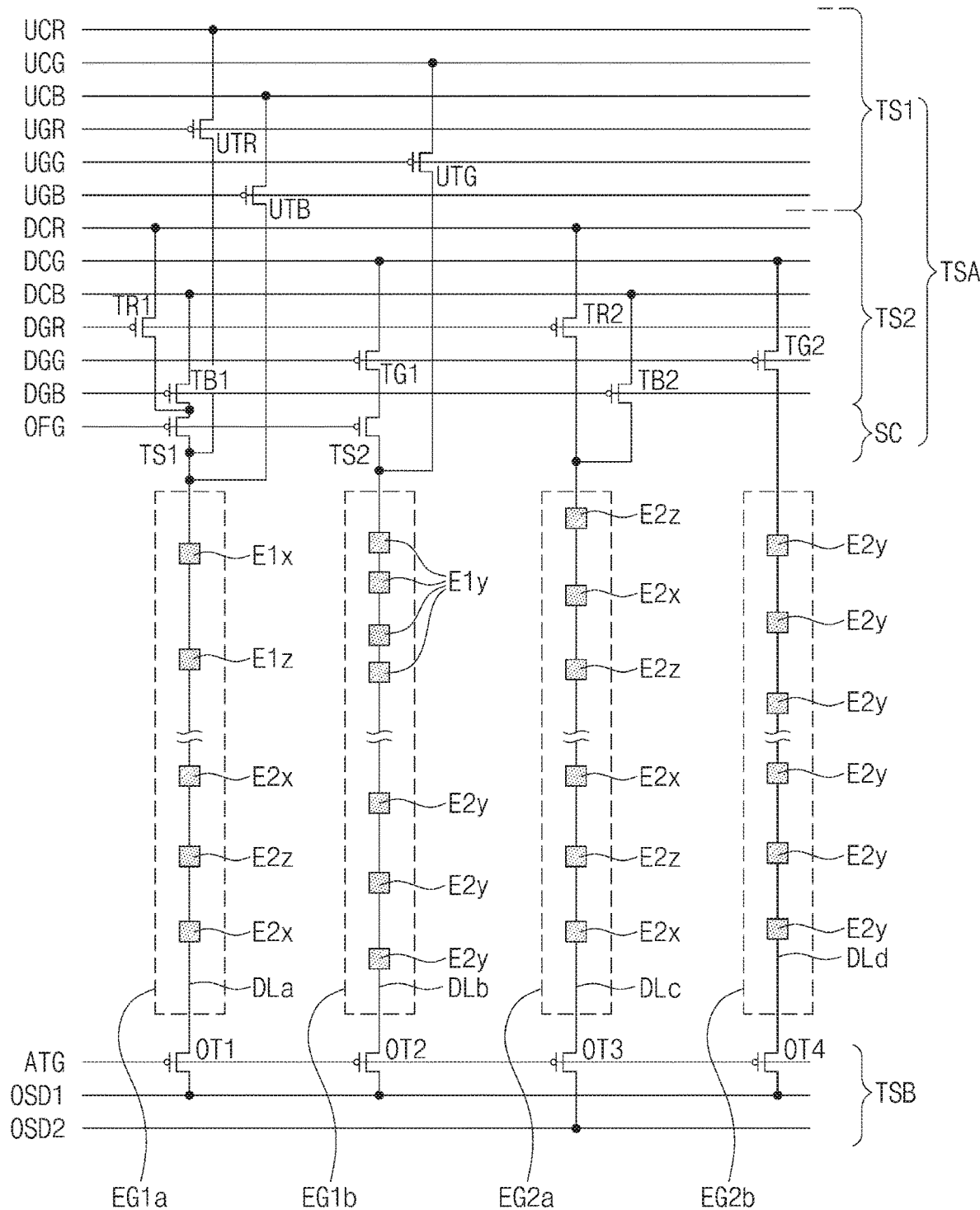
FIG. 10 illustrates an embodiment of a display panel.

FIG. 10 illustrates a schematic diagram partially showing a display panel according to an embodiment of the present invention.

Referring to FIG. 10, a first test part TSA, a second test part TSB, a plurality of first pixels E1x, E1y, and E1z, a plurality of second pixels E2x, E2y, and E2z, and four data lines DLa, DLb, DLc, and DLd are illustrated. The first test part TSA and the second test part TSB may provide test voltages to the pixels E1x, E1y, E1z, E2x, E2y, and E2z. The first test part TSA may include a first test circuit TS1, a second test circuit TS2, and a switch circuit SC. The second test part TSB may be called a third test circuit.

Referring to FIGS. 3 and 10, the first pixels E1x, E1y, and E1z may be the first pixels E11, E12, and E13 and the second pixels E2x, E2y, and E2z may be the second pixels E21, E22, and E23. For example, the first pixels E1x, E1y, and E1z may be located on the first region A1 and the second pixels E2x, E2y, and E2z may be located on the second region A2.

Referring to FIGS. 6 and 10, the first pixels E1x, E1y, and E1z may correspond either to the first pixels E1r, E1g, and E1b located on the first region A11 or to the third pixels E3r, E3g, and E3b located on the third region A31, and the second pixels E2x, E2y, and E2z may correspond to the second pixels E2r, E2g, and E2b located on the second region A21.

The first pixels E1x, E1y, and E1z and the second pixels E2x, E2y, and E2z may be connected to corresponding data lines. The data lines DLa, DLb, DLc, and DLd may be classified into a first group data lines DLa and DLb and a second group data lines DLc and DLd. Each of the first group of data lines DLa and DLb may be connected thereto with a portion of the first pixels E1x, E1y, and E1z located on the first region A1 and a portion of the second pixels E2x, E2y, and E2z located on the second region A2. Each of the second group of data lines DLc and DLd may be connected thereto with only a portion of the second pixels E2x, E2y, and E2z located on the second region A2. For example, the first pixels E1x, E1y, and E1z may not be connected to each of the second group of data lines DLc and DLd. For convenience of description, the data lines DLa, DLb, DLc, and DLd are referred to as a first data line DLa, a second data line DLb, a third data line DLc, and a fourth data line DLd.

The first pixels E1x, E1y, and E1z and the second pixels E2x, E2y, and E2z may be classified into a plurality of emission groups. For example, the emission groups may include a first emission group EG1a connected to the first data line DLa, a first emission group EG1b connected to the second data line DLb, a second emission group EG2a connected to the third data line DLc, and a second emission group EG2b connected to the fourth data line DLd. Even though like terms may be used in this description, the first emission group EG1a may be distinguished from the first emission group EG1b and the second emission group EG2a may be distinguished from the second emission group EG2b.

The first emission group EG1a may include a first red pixel E1x and a first blue pixel E1z of the first pixels E1x, E1y, and E1z, and may also include a second red pixel E2x and a second blue pixel E2z of the second pixels E2x, E2y, and E2z. The first emission group EG1b may include a first green pixel E1y of the first pixels E1x, E1y, and E1z and a second green pixel E2y of the second pixels E2x, E2y, and E2z.

The second emission group EG2a may include a second red pixel E2x and a second blue pixel E1z of the second pixels E2x, E2y, and E2z. The second emission group EG2b may include a second green pixel E2y of the second pixels E2x, E2y, and E2z.

The first test circuit TS1 may provide the first pixels E1x, E1y, and E1z with a first voltage, and the second test circuit TS2 may provide the second pixels E2x, E2y, and E2z with a second voltage different from the first voltage. For example, the first voltage may be less than the second voltage. In one embodiment, the first voltage may be about one volt less than the second voltage, but the embodiments of the present invention are not particularly limited thereto.

The first test circuit TS1 may be connected to a first group of data lines DLa and DLb, each of which may include a portion of the first pixels E1x, E1y, and E1z. The second test circuit TS2 may be connected to the first group data lines DLa and DLb, each of which may include a portion of the second pixels E2x, E2y, and E2z, and to a second group of data lines DLc and DLd, each of which includes a portion of the second pixels E2x, E2y, and E2z. For example, the first group data lines DLa and DLb may be connected to the first test circuit TS1 and the second test circuit TS2, and the second group data lines DLc and DLd may be connected to the second test circuit TS2 and may not be connected to the first test circuit TS1.

The first test circuit TS1 may include a plurality of first test signal lines UCR, UCG, and UCB, a plurality of first test switches UTR, UTG, and UTB, and first test control lines UGR, UGG, and UGB. A first voltage may be provided to each of the first test signal lines UCR, UCG, and UCB. The first test switches UTR, UTG, and UTB may respectively be electrically connected to the first test signal lines UCR, UCG, and UCB and may control delivery of the first voltage. The first test control lines UGR, UGG, and UGB may be respectively connected to the first test switches UTR, UTG, and UTB and may control the on-off states of the first test switches UTR, UTG, and UTB.

The second test circuit TS2 may include a plurality of second test signal lines DCR, DCG, and DCB, a plurality of second test switches TR1, TG1, TB1, TR2, TG2, and TB2, and second test control lines DGR, DGG, and DGB. A second voltage may be provided to each of the second test signal lines DCR, DCG, and DCB. The second test switches TR1, TG1, TB1, TR2, TG2, and TB2 may be electrically connected to corresponding second test signal lines DCR, DCG, and DCB and may control delivery of the second voltage. The second test control lines DGR, DGG, and DGB may be connected to corresponding second test switches TR1, TG1, TB1, TR2, TG2, and TB2 and may control the on-off states of the second test switches TR1, TG1, TB1, TR2, TG2, and TB2.

The switch circuit SC may be connected between the second test circuit TS2 and the first emission groups EG1a and EG1b and may transmit or block the second voltage. The switch circuit SC may include switches TS1 and TS2 and a control line OFG that controls the on-off states of the switches TS1 and TS2. For example, when the first voltage is provided to the first emission groups EG1a and EG1b in the first test circuit TS1, the switches TS1 and TS2 may be turned off to block delivery of the second voltage.

Figure 11:
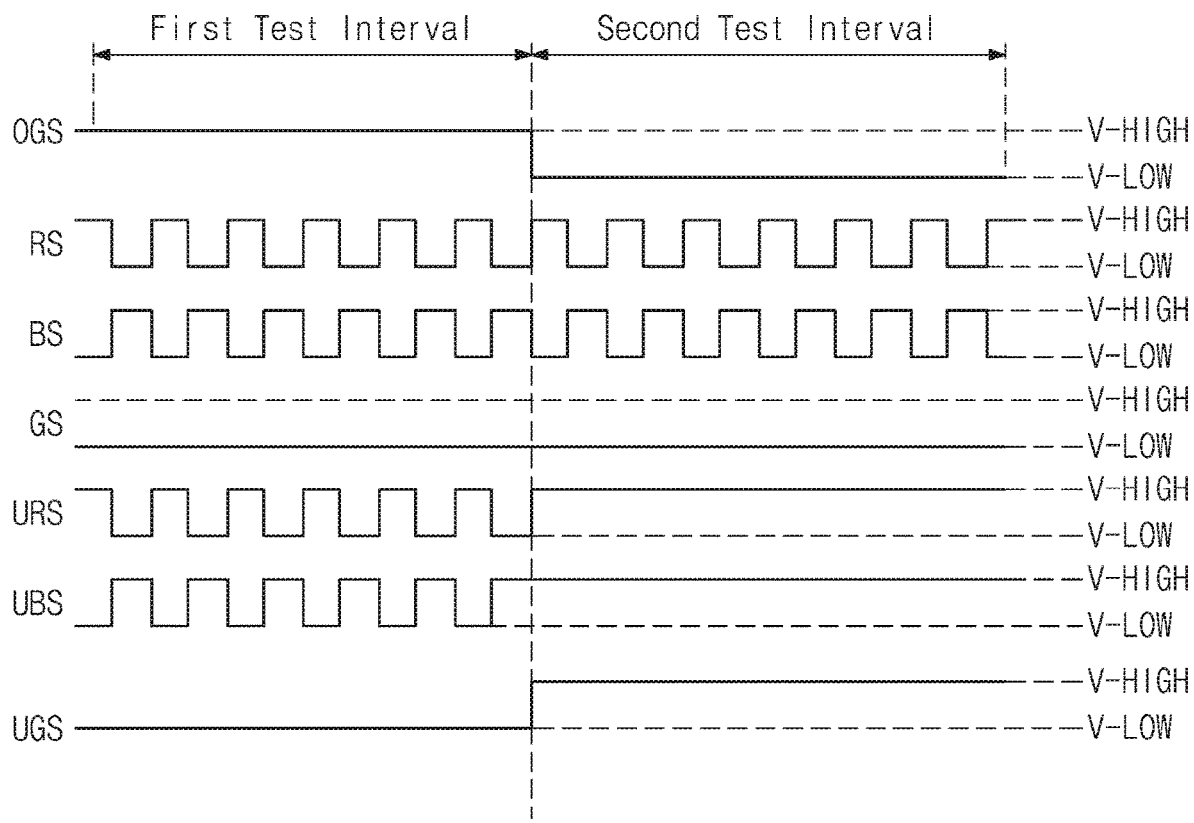
FIG. 11 illustrates an embodiment of signals for driving a test circuit.

FIG. 11 illustrates an embodiment of timing diagrams including signal waveforms for driving a test circuit of FIG. 10. Detailed operation of the first test part TSA will be discussed with reference to FIGS. 10 and 11. Each of signals OGS, RS, BS, GS, URS, UBS, and UGS may have a logically high level V-HIGH for a certain interval and a logically low level V-LOW for another certain interval. The following description will focus on the first emission group EG1a and the second emission group EG2a as an example.

When the switch control signal OGS has a high level V-HIGH, the switch TS1 is turned off. When the switch control signal OGS has a low level V-LOW, the switch TS1 is turned on. When the switch TS1 is turned off, no current path is formed between the second test circuit TS2 and the first emission group EG1a.

A first test interval is may include a duration in which the switch TS1 is turned off, and a second test interval may include a duration in which the switch TS1 is turned on. The first test interval may be a timing at which a voltage is provided to the first pixels E1x and E1z in the first emission group EG1a. The second test interval may be a timing at which a voltage is provided to the second pixels E2x and E2z in the first emission group EG1a.

In the first test interval, the first emission group EG1a may be provided with a first voltage from the first test circuit TS1 and the second emission group EG2a may be provided with a second voltage from the second test circuit TS2. In the second interval, each of the first and second emission groups EG1a and EG2a may be provided with the second voltage from the second test circuit TS2.

An image displayed on the first region (e.g., A1 of FIG. 3) may have a resolution less than that of an image displayed on the second region (e.g., A2 of FIG. 3). When the first pixels E1x, E1y, and E1z and the second pixels E2x, E2y, and E2z are provided with substantially the same voltage to test whether or not a target brightness is achieved, the brightness of the first region (e.g., A1 of FIG. 3) may be measured differently from that of the second region (e.g., A2 of FIG. 3). In one embodiment, each of the first and third regions (e.g., A11 and A31 of FIG. 5) may be measured to have brightness different from that of the second region (e.g., A21 of FIG. 5). Accordingly, this may indicate that good products are determined as defective products or vice versa, which may result in a reduction in test reliability.

According to an embodiment, a test voltage for exhibiting substantially the same target brightness provided to the first pixels E1x, E1y, and E1z located on the first region (e.g., A1 of FIG. 3) or the first and third regions (e.g., A11 and A31 of FIG. 5) may be different from that provided to the second pixels E2x, E2y, and E2z located on the second region (e.g., A2 of FIG. 3) or the second region (e.g., A21 of FIG. 5). For example, in consideration of difference in resolution, a test voltage provided to the first pixels E1x, E1y, and E1z may be less than that provided to the second pixels E2x, E2y, and E2z. In a case of good products, the first region (e.g., A1 of FIG. 3) and the second region (e.g., A2 of FIG. 3) may exhibit substantially the same target brightness. In addition, in the case of good products, the first and third regions (e.g., A11 and A31 of FIG. 5) and the second region (e.g., A21 of FIG. 5) may exhibit substantially the same target brightness. As a result, it may be possible to reduce or remove the likelihood that good products are determined as defective products or vice versa, and accordingly to increase product reliability of the display panel (e.g., EP of FIG. 3 or EP-1 of FIG. 5).

During the first test interval, active control signals URS, UBS, and UGS are provided to the first test control lines UGR, UGG, and UGB. For example, the control signal URS provided to the first test control line UGR may be activated alternately with the control signal UBS provided to the first test control line UGB. The control signal UGS provided to the first test control line UGG may maintain an activation state. In one embodiment, the expression "activated" may include the situation where the control signals URS, UBS, and UGS have a logically low level V-LOW.

For example, when the second transistor (e.g., T2 of FIG. 8) of the first red pixel E1x of the first data line DLa is turned on, the control signal URS may be activated and the first test switch UTR may be turned on to provide the first red pixel E1x with the first voltage through the first test signal line UCR. When the second transistor (e.g., T2 of FIG. 8) of the first blue pixel E1z of the first data line DLa is turned on, the control signal UBS may be activated and the first test switch UTB may be turned on to provide the first blue pixel E1z with the first voltage through the first test signal line UCR.

During the second test interval, inactive control signals URS, UBS, and UGS are provided to the first test control lines UGR, UGG, and UGB. For example, the control signals URS, UBS, and UGS may maintain their logically high levels V-HIGH. Therefore, during the second test interval, the first voltage may not be provided to the first emission group EG1a.

During the first and second test intervals, active control signals RS, BS, and GS are provided to the second test control lines DGR, DGG, and DGB. For example, the control signal RS provided to the second test control line DGR may be activated alternately with the control signal BS provided to the second test control line DGB. The control signal GS provided to the second test control line DGG may maintain an activated state. In one embodiment, the expression "activated" may include the situation where the control signals RS, BS, and GS have logically low levels V-LOW.

The second emission group EG2a may be connected to the second test circuit TS2 and may not be connected to the first test circuit TS1. In addition, the second emission group EG2a may also not be connected to the switch circuit SC. Therefore, during the first and second test intervals, the second emission group EG2a may be supplied with the second voltage provided to the second test signal lines DCR and DCB.

The third test circuit TSB may be connected to the first, second, third, and fourth data lines DLa, DLb, DLc, and DLd. The third test circuit TSB may include third test signal lines OSD1 and OSD2, third test switches OT1, OT2, OT3, and OT4, and a third test control line ATG.

For example, when performing a brightness test with respect to a low-frequency operation interval, the third test circuit TSB may provide the first pixels E1x, E1y, and E1z and the second pixels E2x, E2y, and E2z with a bias voltage provided from the third test signal lines OSD1 and OSD2.

Figure 12:
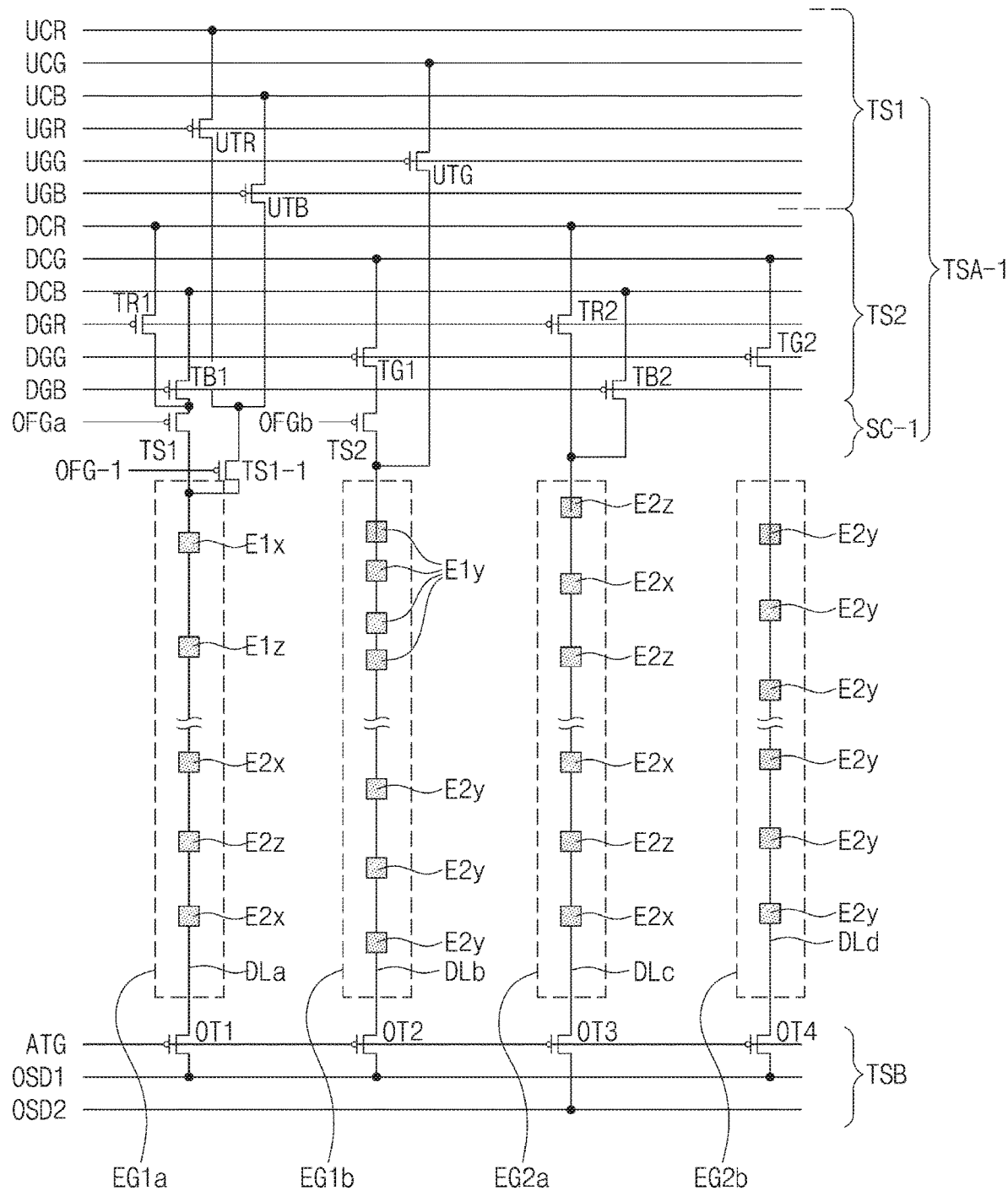
FIG. 12 illustrates an embodiment of a display panel.

FIG. 12 illustrates a diagram partially showing a display panel according to an embodiment of the present invention. In explanation of FIG. 12, like reference numerals are allocated to like components as discussed in FIG. 10.

Referring to FIG. 12, a first test part TSA-1, a second test part TSB, a plurality of first pixels E1x, E1y, and E1z, a plurality of second pixels E2x, E2y, and E2z, and four data lines DLa, DLb, DLc, and DLd are illustrated. The first test part TSA-1 may include a first test circuit TS1, a second test circuit TS2, and a switch circuit SC-1. The switch circuit SC-1 may be connected between the second test circuit TS2 and the first emission groups EG1a and EG1b and may transmit or block the second voltage. In addition, the switch circuit SC-1 may be connected between the first test circuit TS1 and the first emission group EG1a and may transmit or block the first voltage.

The switch circuit SC-1 may include switches TS1, TS2, and TS1-1 and control lines OFGa, OFGb, and OFG-1 that control the on-off states of the switches TS1, TS2, and TS1-1. For example, when the first voltage is provided to the first emission groups EG1a and EG1b in the first test circuit TS1, the switches TS1 and TS2 may be turned off to block delivery of the second voltage. In this case, the switch TS1-1 may be turned on.

The number of the first pixels E1x included in the first emission group EG1a may be less than that of the first pixels E1y included in the first emission group EG1b. To exhibit target brightness, the first voltage may be provided to the first emission group EG1b and the second voltage may be provided to the second emission group EG2a. In this case, the switch TS1 may be turned on and the switches TS2 and TS1-1 may be turned off. Thus, the first emission group EG1a may receive the second voltage from the second test circuit TS2 and the first emission group EG1b may receive the first voltage from the first test circuit TS1.

Referring to FIGS. 3 and 12, the first pixels E1x, E1y, and E1z may be the first pixels E11, E12, and E13 and the second pixels E2x, E2y, and E2z may be the second pixels E21, E22, and E23. For example, the first pixels E1x, E1y, and E1z may be located on the first region A1 and the second pixels E2x, E2y, and E2z may be located on the second region A2.

Referring to FIGS. 6 and 12, the first pixels E1x, E1y, and E1z may correspond either to the first pixels E1r, E1g, and E1b located on the first region A11 or to the third pixels E3r, E3g, and E3b located on the third region A31. The second pixels E2x, E2y, and E2z may correspond to the second pixels E2r, E2g, and E2b located on the second region A21.

Figure 13:
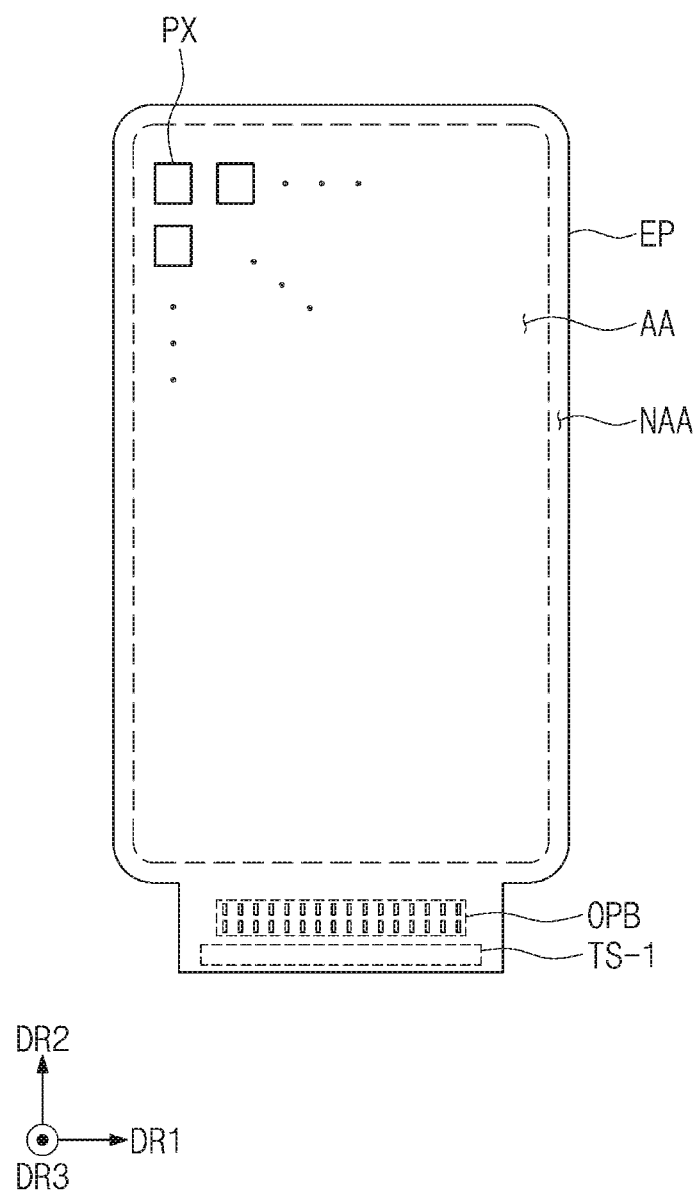
FIG. 13 illustrates an embodiment of a display panel.
Figure 14:
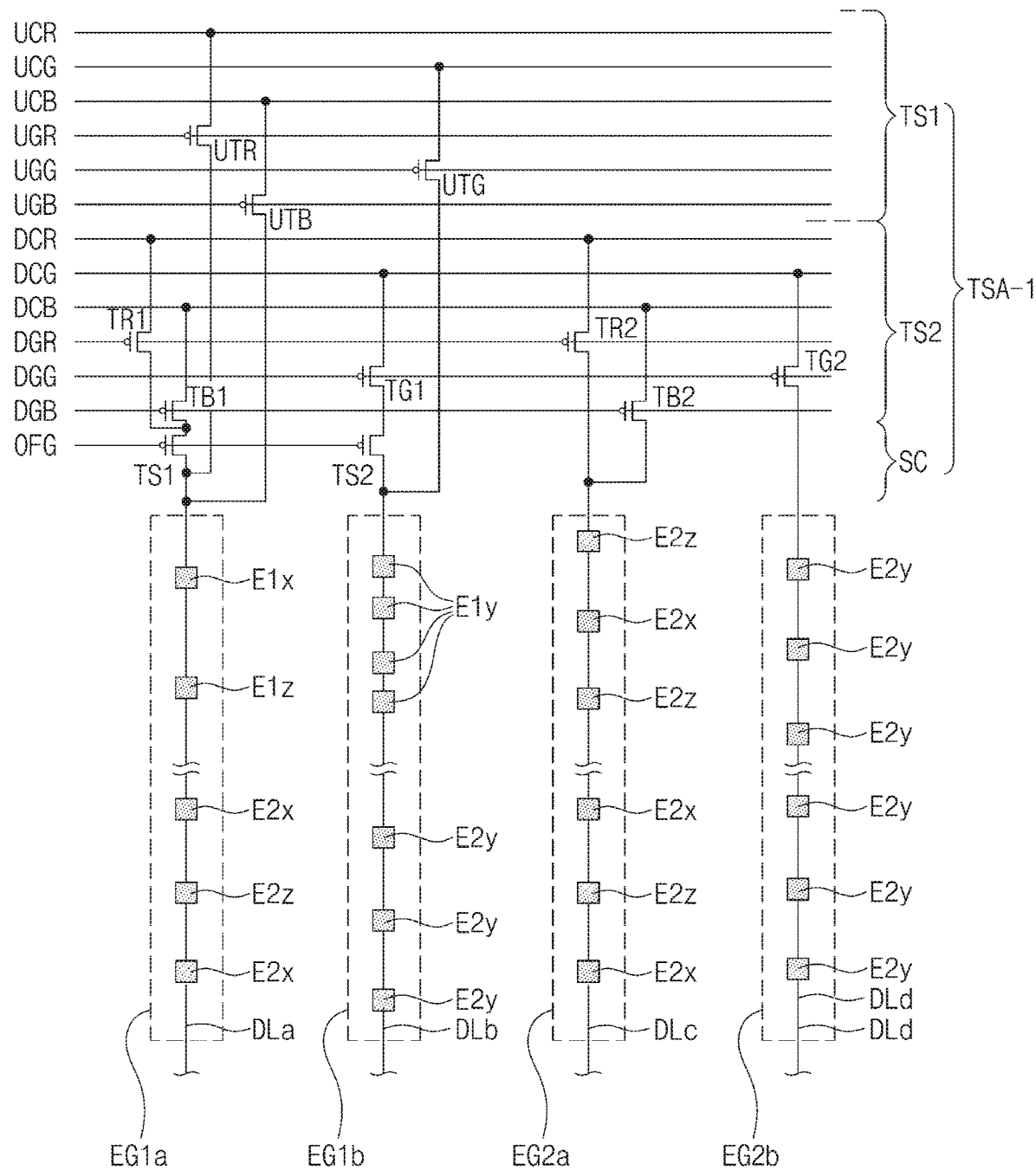
FIG. 14 illustrates an embodiment of a display panel.

FIG. 13 illustrates a plan view showing a display panel according to an embodiment of the present invention. FIG. 14 illustrates a diagram partially showing a display panel according to an embodiment of the present invention.

Referring to FIGS. 13 and 14, the display panel EP may include pixels PX located on the active region AA, a test part TS-1 located on the peripheral region NAA, and a plurality of bumps OPB located on the peripheral region NAA. The test part TS-1 may include a first test circuit TS1, a second test circuit TS2, and a switch circuit SC. In comparison with the test part TS discussed above in FIG. 7, the test part TS-1 may not include the second test part TSB.

The first test circuit TS1 may be connected to first group data lines DLa and DLb each including a portion of the first pixels E1x, E1y, and E1z. The second test circuit TS2 may be connected to first group data lines DLa and DLb each including a portion of the second pixels E2x, E2y, and E2z and to second group data lines DLc and DLd each including a portion of the second pixels E2x, E2y, and E2z. The switch circuit SC may be connected between the second test circuit TS2 and the first emission groups EG1a and EG1b, and may transmit or block the second voltage.

Referring to FIGS. 3 and 14, the first pixels E1x, E1y, and E1z may be the first pixels E11, E12, and E13 and the second pixels E2x, E2y, and E2z may be the second pixels E21, E22, and E23. For example, the first pixels E1x, E1y, and E1z may be located on the first region A1 and the second pixels E2x, E2y, and E2z may be located on the second region A2.

Referring to FIGS. 6 and 12, the first pixels E1x, E1y, and E1z may correspond either to the first pixels E1r, E1g, and E1b located on the first region A11 or to the third pixels E3r, E3g, and E3b located on the third region A31. The second pixels E2x, E2y, and E2z may correspond to the second pixels E2r, E2g, and E2b located on the second region A21.

In accordance with one or more of the aforementioned embodiments, a display panel may include a first region and a second region having resolutions that are different from each other. A test voltage for exhibiting substantially the same target brightness provided to first pixels located on the first region may be different from that provided to second pixels located on the second region. For example, the difference in resolution may be considered to determine a test voltage provided to each pixel. In a case where the display panel is a good product (e.g., does not have a target defect), the first region and the second region may exhibit substantially the same target brightness. As a result, it may be possible to reduce or remove the likelihood that good products are determined as defective products or vice versa, and accordingly to increase product reliability of the display panel.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, devices, modules, units, multiplexers, generators, logic, interfaces, drivers, and other signal generating and signal processing features of the embodiments disclosed herein may be implemented, for example, in non-transitory logic that may include hardware, software, or both. When implemented at least partially in hardware, the controllers, processors, devices, modules, units, multiplexers, generators, logic, interfaces, drivers, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Although the embodiments have been described with reference to a number of illustrative examples thereof, it will be understood by those of ordinary skill in the art that various changes in form and details may be made without departing from the spirit and scope of the embodiments of the present invention as set forth in the following claims. Thus, the technical scope of the present invention is not limited by the embodiments and examples described above, but by the following claims.

What is claimed is:

1. A display panel, comprising:
a plurality of first pixels on a first region having a first resolution;
a plurality of second pixels on a second region having a second resolution greater than the first resolution; and
a test circuit configured to provide one or more test voltages to the plurality of first pixels and the plurality of second pixels, wherein the test circuit includes:
a first test circuit configured to provide the plurality of first pixels with a first voltage; and
a second test circuit configured to provide the plurality of second pixels with a second voltage different from the first voltage, wherein the first voltage causes the plurality of first pixels to exhibit a target brightness which is equal to a target brightness exhibited by the plurality of second pixels as a result of the second voltage.

2. A display panel, comprising:
a plurality of first pixels on a first region;
a plurality of second pixels on a second region having a transmittance less than a transmittance of the first region;
a first group data line electrically connected to a first emission group;
a second group data line electrically connected to a second emission group; and
a test circuit configured to provide one or more test voltages to the plurality of first pixels and the plurality of second pixels, wherein the test circuit includes:
a first test circuit configured to provide the plurality of first pixels with a first voltage; and
a second test circuit configured to provide the plurality of second pixels with a second voltage different from the first voltage, wherein:
the plurality of first pixels and the plurality of second pixels are classified into the first emission group and the second emission group,
the first emission group includes some of the plurality of first pixels and some of the plurality of second pixels, and
the second emission group includes some of the plurality of second pixels but excludes the plurality of first pixels.

3. The display panel of claim 2, wherein:
the first emission group is electrically connected to the first test circuit and the second test circuit, and
the second emission group is electrically connected to the second test circuit.

4. The display panel of claim 2, wherein:
the test circuit includes a switch circuit connected to the first emission group, and
the switch circuit is configured to transmit or block the second voltage.

5. The display panel of claim 4, wherein:
the first test circuit includes:
a plurality of first test signal lines configured to receive the first voltage;
a plurality of first test switches connected to the plurality of first test signal lines; and
a plurality of first test control lines that control on-offs of the plurality of first test switches, and
the second test circuit includes:
a plurality of second test signal lines configured to receive the second voltage;
a plurality of second test switches connected to the plurality of second test signal lines; and
a plurality of second test control lines configured to control on-off states of the plurality of second test switches.

6. The display panel of claim 5,
wherein the first group data line is electrically connected to the first test circuit,
wherein the first group data line is electrically connected through the switch circuit to the second test circuit, and
wherein the second group data line is electrically connected to the second test circuit.

7. The display panel of claim 1, wherein a number of first pixels located on a certain area among the plurality of first pixels is less than a number of second pixels located on the certain area among the plurality of second pixels.

8. The display panel of claim 1, wherein a level of the first voltage is less than a level of the second voltage.

9. The display panel of claim 1, wherein the test circuit includes:

a third test circuit configured to provide a bias voltage to the plurality of first pixels and the plurality of second pixels.

10. An electronic device, comprising:
an electronic module; and
a display panel comprising a first region and a second region adjacent to the first region, the first region overlapping the electronic module, wherein the display panel includes:
a plurality of first pixels on the first region;
a plurality of second pixels on the second region having a transmittance different from a transmittance of the first region;
a first group data line connected to one of the plurality of first pixels and one of the plurality of second pixels;
a second group data line connected to another of the plurality of second pixels; and
a test circuit comprising a first test circuit connected to the first group data line to apply a first voltage to the plurality of first pixels, a second test circuit connected to the second group data line to apply a second voltage to the plurality of second pixels, and a switch circuit connected between the first group data line and the second test circuit, wherein the first voltage is different from the second voltage and wherein the first voltage and the second voltage cause the plurality of first pixels and the plurality of second pixels to emit light having substantially a same target brightness.

11. The electronic device of claim 10, wherein the transmittance of the first region is greater than the transmittance of the second region.

12. The electronic device of claim 10, wherein a first number of first pixels located on a certain area among the plurality of first pixels is less than a second number of second pixels located on the certain area among the plurality of second pixels.

13. The electronic device of claim 10, wherein the test circuit includes a third test circuit connected to the first group data line and the second group data line.

14. A method of fabricating an electronic device, the method comprising:
testing a display panel that includes a plurality of first pixels on a first region, a plurality of second pixels on a second region having a transmittance less than a transmittance of the first region, and a test circuit configured to provide test voltages to the plurality of first pixels and the plurality of second pixels; and
cutting a portion of the display panel,
wherein testing the display panel includes:
performing a first test operation that includes providing a first voltage to a first group data line connected to some of the plurality of first pixels and some of the plurality of second pixels and providing a second voltage to a second group data line connected to some other of the plurality of second pixels, the second voltage being different from the first voltage; and
performing a second test operation that includes providing the second voltage to the first group data line and providing the second voltage to the second group data line, wherein the first voltage and the second voltage cause light to be emitted from the plurality of first pixels and the plurality of second pixels with substantially a same target brightness.

15. The method of claim 14, wherein:
the first voltage is provided from a first test circuit of the test circuit;
the second voltage is provided from a second test circuit of the test circuit;
wherein a switch circuit is connected between the second test circuit and the first group data line, and
wherein the first test operation includes turning the switch circuit off, and
wherein the second test operation includes turning the switch circuit on.

16. The method of claim 15, wherein:
the test circuit includes a plurality of test pads electrically connected to the first test circuit, the second test circuit, and the switch circuit,
cutting the portion of the display panel includes cutting and removing a test pad area on which the plurality of test pads are mounted.

17. The method of claim 15, wherein:
testing the display panel includes providing a bias voltage to the first group data line and the second group data line,
the method includes providing, from a third test circuit of the test circuit, the bias voltage to the first group data line and the second group data line.

18. The method of claim 14, wherein a level of the first voltage is less than a level of the second voltage.

19. The method of claim 14, wherein an electronic module of the electronic device overlaps the first region of the display panel.

* * * * *